(12) United States Patent
Yun et al.

(10) Patent No.: US 12,124,049 B2
(45) Date of Patent: Oct. 22, 2024

(54) IMAGE SENSOR INCLUDING COLOR SEPARATING LENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Seokho Yun, Seoul (KR); Sookyoung Roh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 17/514,692

(22) Filed: Oct. 29, 2021

(65) Prior Publication Data
US 2022/0137423 A1  May 5, 2022

(30) Foreign Application Priority Data

Oct. 29, 2020 (KR) .................. 10-2020-0142529
Aug. 3, 2021 (KR) .................. 10-2021-0102020

(51) Int. Cl.
*H04N 5/232* (2006.01)
*G02B 27/10* (2006.01)
(Continued)

(52) U.S. Cl.
CPC ....... *G02B 27/1013* (2013.01); *G02B 27/123* (2013.01); *H04N 9/01* (2023.01); *H01L 27/14621* (2013.01); *H04N 25/134* (2023.01)

(58) Field of Classification Search
None
See application file for complete search history.

(56) References Cited

U.S. PATENT DOCUMENTS 9,935,146 B1    4/2018 Lee
2008/0128843 A1*  6/2008 Lee .................. H01L 27/14627
                                                       257/E31.127
(Continued)

FOREIGN PATENT DOCUMENTS

EP      1 696 249 A1    8/2006
JP    2009-252978 A   10/2009
(Continued)

OTHER PUBLICATIONS

Bo Han Chen et al., "GaN Metalens for Pixel-Level Full-Color Routing at Visible Light", Nano Letters, 17, DOI: 10.1021/acs.nanolett.7b03135, Sep. 2017, 8 pages total.
(Continued)

*Primary Examiner* — Twyler L Haskins
*Assistant Examiner* — Wesley J Chiu
(74) *Attorney, Agent, or Firm* — Sughrue Mion, PLLC

(57) ABSTRACT

Provided is an image sensor including a sensor substrate including a first pixel configured to sense light of a first wavelength, and a second pixel configured to sense light of a second wavelength, and a color separating lens array configured to concentrate the light of the first wavelength on the first pixel, and the light of the second wavelength on the second pixel, the color separating lens array including a first pixel-corresponding area corresponding to the first pixel, and a second pixel-corresponding area corresponding to the second pixel, wherein a first phase difference between the light of the first wavelength that has traveled through a center of the first pixel-corresponding area and a center of the second pixel-corresponding area is different than a second phase difference between the light of the second wavelength that has traveled through the center of the first pixel-corresponding area and the center of the second pixel-corresponding area.

26 Claims, 32 Drawing Sheets

(51) Int. Cl.
  *G02B 27/12*   (2006.01)
  *H04N 9/01*   (2023.01)
  *H01L 27/146*   (2006.01)
  *H04N 25/13*   (2023.01)

(56) References Cited

U.S. PATENT DOCUMENTS

| | | |
|---|---|---|
| 2009/0250594 A1 | 10/2009 | Tanaka et al. |
| 2014/0267865 A1* | 9/2014 | Kishi .................... H04N 25/75 |
| | | 348/310 |
| 2014/0327783 A1* | 11/2014 | Nishiwaki ......... H01L 27/14649 |
| | | 257/432 |
| 2016/0064448 A1* | 3/2016 | Shin .................. H01L 27/14625 |
| | | 257/292 |
| 2017/0212285 A1* | 7/2017 | Arbabi .................... G02B 1/002 |
| 2018/0216797 A1 | 8/2018 | Khorasaninejad et al. |
| 2019/0191144 A1 | 6/2019 | Arbabi et al. |
| 2021/0124179 A1 | 4/2021 | Yun et al. |
| 2021/0126032 A1 | 4/2021 | Roh et al. |
| 2021/0288095 A1* | 9/2021 | Delga ................. H01L 27/1465 |
| 2022/0137424 A1* | 5/2022 | Lee ..................... H01L 27/1462 |
| | | 257/432 |
| 2023/0387162 A1* | 11/2023 | Sun .................. H01L 27/14627 |

FOREIGN PATENT DOCUMENTS

| | | |
|---|---|---|
| KR | 10-2011-0001255 A | 1/2011 |
| WO | 2018/052750 A1 | 3/2018 |
| WO | 2020/007622 A1 | 1/2020 |

OTHER PUBLICATIONS

Communication dated Mar. 17, 2022 issued by the European Patent Office in European Application No. 21205336.7.

Communication dated Aug. 16, 2024 issued by the European Patent Office in counterpart European Application No. 21 205 336.7.

* cited by examiner

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

IMAGE SENSOR INCLUDING COLOR SEPARATING LENS ARRAY AND ELECTRONIC DEVICE INCLUDING THE IMAGE SENSOR

CROSS-REFERENCE TO RELATED APPLICATIONS

This application is based on and claims priority under 35 U.S.C. § 119 to Korean Patent Application Nos. 10-2020-0142529, filed on Oct. 29, 2020, and 10-2021-0102020, filed on Aug. 3, 2021 in the Korean Intellectual Property Office, the disclosures of which are incorporated by reference herein in their entireties.

BACKGROUND

1. Field

Example embodiments of the present disclosure relate to an image sensor including a color separating lens array configured to separate incident light based on wavelength and concentrate the separated light, and an electronic device including the image sensor.

2. Description of Related Art

An image sensor generally senses a color of incident light by using a color filter. However, as a color filter absorbs light of all other colors except for light of one particular color, the light utilization efficiency may decline. For example, when an red-green-blue (RGB) color filter is used, only one third of incident light is transmitted, and the other two thirds of incident light is absorbed and wasted. Accordingly, the light utilization efficiency may be merely about 33%. Thus, most optical loss occurs at color filters in color display devices or color image sensors.

SUMMARY

One or more example embodiments provide an image sensor with improved light utilization efficiency and auto focusing function achieved by using a color separating lens array configured to divide incident light based on a wavelength, and an electronic device including the image sensor.

Additional aspects will be set forth in part in the description which follows and, in part, will be apparent from the description, or may be learned by practice of example embodiments.

According to an aspect of an example embodiment, there is provided an image sensor including a sensor substrate including a first pixel configured to sense light of a first wavelength, and a second pixel configured to sense light of a second wavelength, and a color separating lens array configured to concentrate, among incident light, the light of the first wavelength on the first pixel, and the light of the second wavelength on the second pixel, wherein the color separating lens array includes a first pixel-corresponding area corresponding to the first pixel, and a second pixel-corresponding area corresponding to the second pixel, wherein a first phase difference between the light of the first wavelength that has traveled through a center of the first pixel-corresponding area and the light of the first wavelength that has traveled through a center of the second pixel-corresponding area is different than a second phase difference between the light of the second wavelength that has traveled through the center of the first pixel-corresponding area and the light of the second wavelength that has traveled through the center of the second pixel-corresponding area.

The first pixel may include at least two light sensing cells configured to sense the light of the first wavelength.

The second pixel may include at least two light sensing cells configured to sense the light of the second wavelength.

The light of the first wavelength that has traveled through the center of the first pixel-corresponding area may have a phase profile decreasing in a direction away from the center of the first pixel-corresponding area, and the light of the second wavelength that has traveled through the center of the second pixel-corresponding area may have a phase profile decreasing in a direction away from the center of the second pixel-corresponding area.

The first wavelength may be longer than the second wavelength, and the first phase difference may be smaller than the second phase difference.

The first wavelength may be longer than the second wavelength, and the first phase may be 60% to 90% of the second phase difference.

The first wavelength may be longer than the second wavelength, the first phase difference may range from $0.9\pi$ to $1.1\pi$, and the second phase difference may range from $1.1\pi$ to $1.5\pi$.

The first wavelength may be shorter than the second wavelength, and the first phase difference may be greater than the second phase difference.

The first wavelength may be shorter than the second wavelength, and the first phase difference may be 110% to 150% of the second phase difference.

The first wavelength may be shorter than the second wavelength, the first phase difference may range from $0.9\pi$ to $1.1\pi$, and the second phase difference may range from $0.6\pi$ to $0.9\pi$.

According to another aspect of an example embodiment, there is provided an image sensor including a sensor substrate including a first pixel configured to sense light of a first wavelength, and a second pixel configured to sense light of a second wavelength, and a color separating lens array including a first-wavelength light concentration area configured to concentrate, among incident light, the light of the first wavelength on the first pixel, and a second-wavelength light concentration area configured to concentrate, among incident light, the light of the second wavelength on the second pixel, wherein an area of the first-wavelength light concentration area is greater than an area of the first pixel, and an area of the second-wavelength light concentration area is greater than an area of the second pixel, and wherein a second focal distance of the light of the second wavelength by the second-wavelength light concentration area is 90% to 100% of a first focal distance of the light of the first wavelength by the first-wavelength light concentration area.

The first pixel may include at least two light sensing cells configured to sense the light of the first wavelength.

The second pixel may include at least two light sensing cells configured to sense the light of the second wavelength.

The light of the first wavelength that has traveled through a center of the first-wavelength light concentration area may have a phase delay profile decreasing in a direction away from the center of the first-wavelength light concentration area, and the light of the second wavelength that has traveled through a center of the second-wavelength light concentration area may have a phase delay profile decreasing in a direction away from the center of the second-wavelength light concentration area.

The first-wavelength light concentration area and the second-wavelength light concentration area may partially overlap.

The second focal distance may be identical to the first focal distance.

According to yet another aspect of an example embodiment, there is provided an image sensor including a sensor substrate including a first pixel configured to sense light of a first wavelength, and a second pixel configured to sense light of a second wavelength, and a color separating lens array including a first-wavelength light concentration area configured to concentrate, among incident light, the light of the first wavelength on the first pixel, and a second-wavelength light concentration area configured to concentrate, among incident light, the light of the second wavelength on the second pixel, wherein an area of the first-wavelength light concentration area is greater than an area of the first pixel, and an area of the second-wavelength light concentration area is greater than an area of the second pixel, wherein the light of the first wavelength that has traveled through a center of the first-wavelength light concentration area has a phase profile maximized at the center of the first-wavelength light concentration area and decreasing in a direction away from the center of the first-wavelength light concentration area, wherein the light of the second wavelength that has traveled through a center of the second-wavelength light concentration area has a phase profile maximized at the center of the second-wavelength light concentration area and decreasing in a direction away from the center of the second-wavelength light concentration area, and wherein a phase reduction rate of light of the first wavelength is different than a phase reduction rate of light of the second wavelength.

The first pixel may include at least two light sensing cells configured to sense the light of the first wavelength.

The second pixel may include at least two light sensing cells configured to sense the light of the second wavelength.

The first wavelength may be longer than the second wavelength, and the phase reduction rate of the first wavelength may be smaller than the phase reduction rate of the second wavelength.

The first wavelength may be shorter than the second wavelength, and the phase reduction rate of the first wavelength may be greater than the phase reduction rate of the second wavelength.

The first-wavelength concentration area and the second-wavelength concentration area may partially overlap.

According to yet another aspect of an example embodiment, there is provided an image sensor including a sensor substrate including a first pixel configured to sense light of a first wavelength, and a second pixel configured to sense light of a second wavelength, and a color separating lens array including a first-wavelength light concentration area configured to concentrate, among incident light, the light of the first wavelength on the first pixel, and a second-wavelength light concentration area configured to concentrate, among incident light, the light of the second wavelength on the second pixel, wherein a first phase difference between the light of the first wavelength that has traveled through a center of the first-wavelength light concentration area and the light of the first wavelength that has traveled through a position spaced apart from the center of the first-wavelength light concentration area by ½ of a pixel pitch of the sensor substrate is different than a second phase difference between the light of the second wavelength that has traveled through a center of the second-wavelength light concentration area and the light of the second wavelength that has traveled through a position spaced apart from the center of the second-wavelength light concentration area by ½ of the pixel pitch of the sensor substrate.

The first pixel may include at least two light sensing cells configured to sense the light of the first wavelength.

The second pixel may include at least two light sensing cells configured to sense the light of the second wavelength.

An area of the first-wavelength light concentration area may be greater than an area of the first pixel, and an area of the second-wavelength light concentration area may be greater than an area of the second pixel.

The first wavelength may be longer than the second wavelength, and the first phase difference may be smaller than the second phase difference.

The first wavelength may be shorter than the second wavelength, and the first phase difference may be greater than the second phase difference.

According to yet another aspect of an example embodiment, there is provided an electronic device including an image sensor configured to convert an optical image into an electrical signal, and a processor configured to control operations of the image sensor, and store and output a signal generated by the image sensor, wherein the image sensor includes a sensor substrate including a first pixel configured to sense light of a first wavelength, and a second pixel configured to sense light of a second wavelength, and a color separating lens array including a first-wavelength light concentration area configured to concentrate, among incident light, the light of the first wavelength on the first pixel, and a second-wavelength light concentration area configured to concentrate, among incident light, the light of the second wavelength on the second pixel, wherein an area of the first-wavelength light concentration area is greater than an area of the first pixel, and an area of the second-wavelength light concentration area is greater than an area of the second pixel, and wherein a second focal distance of the light of the second wavelength by the second-wavelength light concentration area is 90% to 100% of a first focal distance of the light of the first wavelength by the first-wavelength light concentration area.

The first pixel may include at least two light sensing cells configured to sense the light of the first wavelength.

The second pixel may include at least two light sensing cells configured to sense light of the second wavelength.

The light of the first wavelength that has traveled through the center of the first-wavelength light concentration area may have a phase delay profile decreasing in a direction away from a center of the first-wavelength light concentration area, and the light of the second wavelength that has traveled through a center of the second-wavelength light concentration area may have a phase delay profile decreasing in a direction away from the center of the second-wavelength light concentration area.

The first-wavelength light concentration area and the second-wavelength light concentration area may partially overlap.

The second focal distance may be identical to the first focal distance.

According to yet another aspect of an example embodiment, there is provided an image sensor including a sensor substrate including a first pixel including at least two light sensing cells respectively configured to sense light of a first wavelength, and a second pixel including at least two light sensing cells respectively configured to sense light of a second wavelength, and a color separating lens array configured to concentrate, among incident light, the light of the first wavelength on the first pixel, and the light of the second wavelength on the second pixel, wherein the color separating lens array includes a first pixel-corresponding area provided to correspond to the first pixel, and a second pixel-corresponding area provided to correspond to the second pixel, wherein a phase difference between the light of the first wavelength that has traveled through a center of the first pixel-corresponding area and the light of the first wavelength that has traveled through a center of the second pixel-corresponding area is different than a phase difference between the light of the second wavelength that has traveled through the center of the first pixel-corresponding area and the light of the second wavelength that has traveled through the center of the second pixel-corresponding area.

BRIEF DESCRIPTION OF THE DRAWINGS

The above and/or other aspects, features, and advantages of certain example embodiments of the disclosure will be more apparent from the following description taken in conjunction with the accompanying drawings, in which:

FIGS. 2A, 2B, and 2C are diagrams illustrating examples of various pixel arrays of an image sensor;

DETAILED DESCRIPTION

Figure 1:
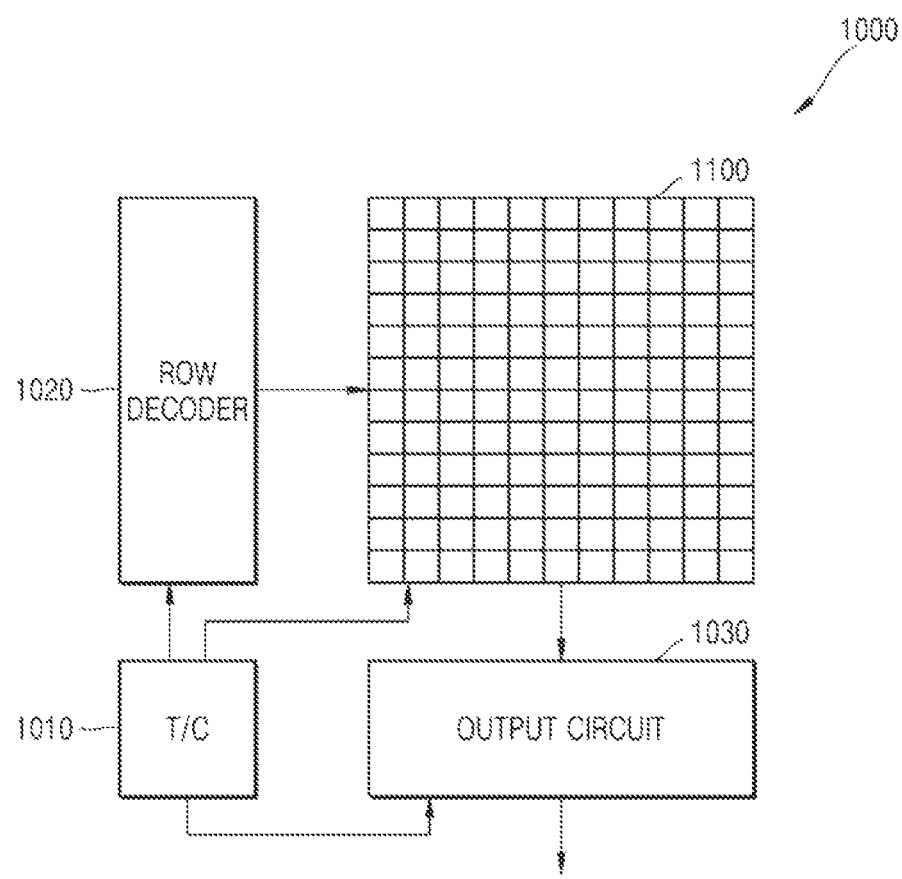
FIG. 1 is a block diagram of an image sensor according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an image sensor including a color separating lens array and an electronic device including the image sensor will be described in detail with reference to the accompanying drawings. The example embodiments described herein are provided merely as an example, and various modifications may be possible from the embodiments. In the drawings, like reference numerals in the drawings denote like elements, and sizes of components in the drawings may be exaggerated for clarity and convenience of explanation.

When a component is "on," "on the top of," etc. another component, it shall be understood that not only the component may be directly on, under, on the left of, or on the right of another component, but also it may be on, under, on the left of, or on the right of another component in a non-contact manner.

While such terms as "first," "second," etc., may be used to describe various components, such terms are used only to distinguish one component from another. These terms are not intended to define that materials or structures of components are different.

An expression used in the singular encompasses the expression of the plural, unless it has a clearly different meaning in the context. When a portion "includes" an element, another element may be further included, rather than excluding the existence of the other element, unless otherwise described.

In addition, the terms " . . . part," "module," etc., described in the specification refer to a unit for processing at least one function or operation, which can be implemented by a hardware or a software, or a combination of a hardware and a software.

The use of the terms "a" and "an" and "the" and similar referents in the context of describing embodiments (especially in the context of the following claims) are to be construed to cover both the singular and the plural.

Also, the steps of all methods described herein can be performed in any suitable order unless otherwise indicated herein or otherwise clearly contradicted by context. The use of any and all exemplary languages (e.g., "such as") provided herein, are intended merely to better illuminate the technical ideas and does not pose a limitation on the scope of rights unless otherwise claimed.

FIG. 1 is a block diagram of an image sensor according to an example embodiment. With reference to FIG. 1, the image sensor 1000 may include a pixel array 1100, a timing controller 1010, a row decoder 1020, and an output circuit 1030. The image sensor may be a charge coupled device (CCD) image sensor or a complementary metal oxide semiconductor (CMOS) image sensor.

The pixel array 1100 may include pixels arranged in a two-dimensional manner in a plurality of rows and columns. The row decoder 1020 may select one of the rows of the pixel array 1100 in response to a row address signal output from the timing controller 1010. The output circuit 1030 may output a light sensing signal by the column from a plurality of pixels arranged along the selected row. To this end, the output circuit 1030 may include a column decoder and an analog-to-digital converter (ADC). For example, the output circuit 1030 may include a plurality of ADCs respectively arranged between the column decoder and the pixel array 1100 for each column decoder, or an ADC arranged at an output terminal of the column decoder. The timing controller 1010, the row decoder 1020, and the output circuit 1030 may be implemented in one chip or separate chips. A processor configured to process an image signal output through the output circuit 1030 may be implemented in a single chip together with the timing controller 1010, the row decoder 1020, and the output circuit 1030.

Figure 2A:
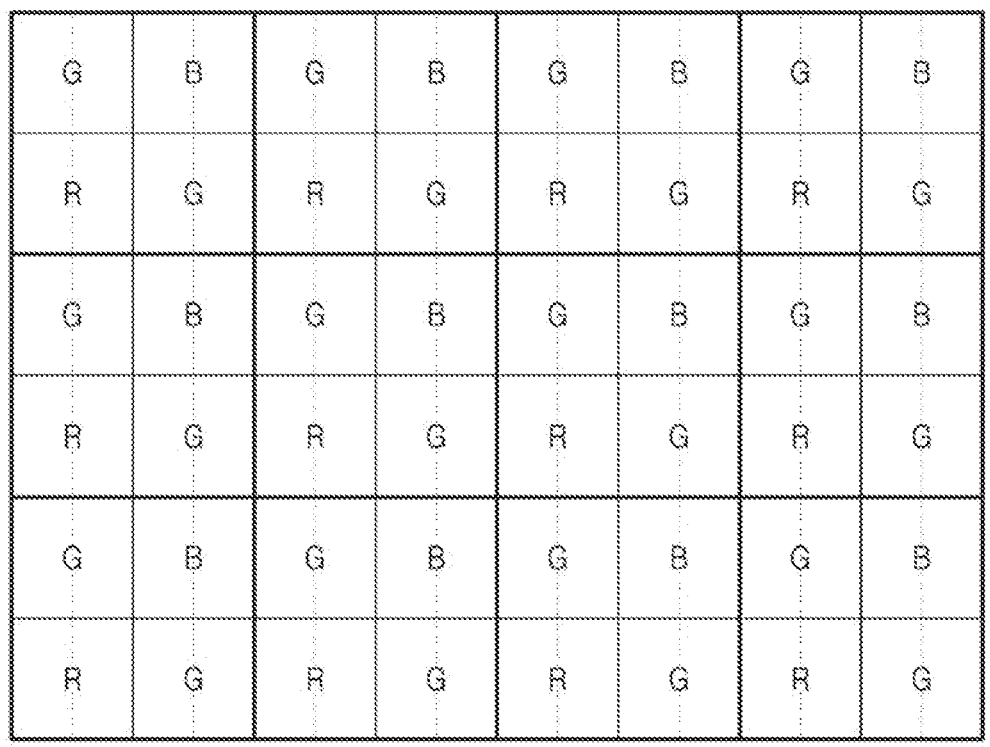
Figure 2A:
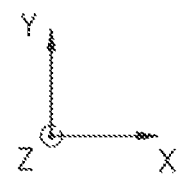
Figure 2B:
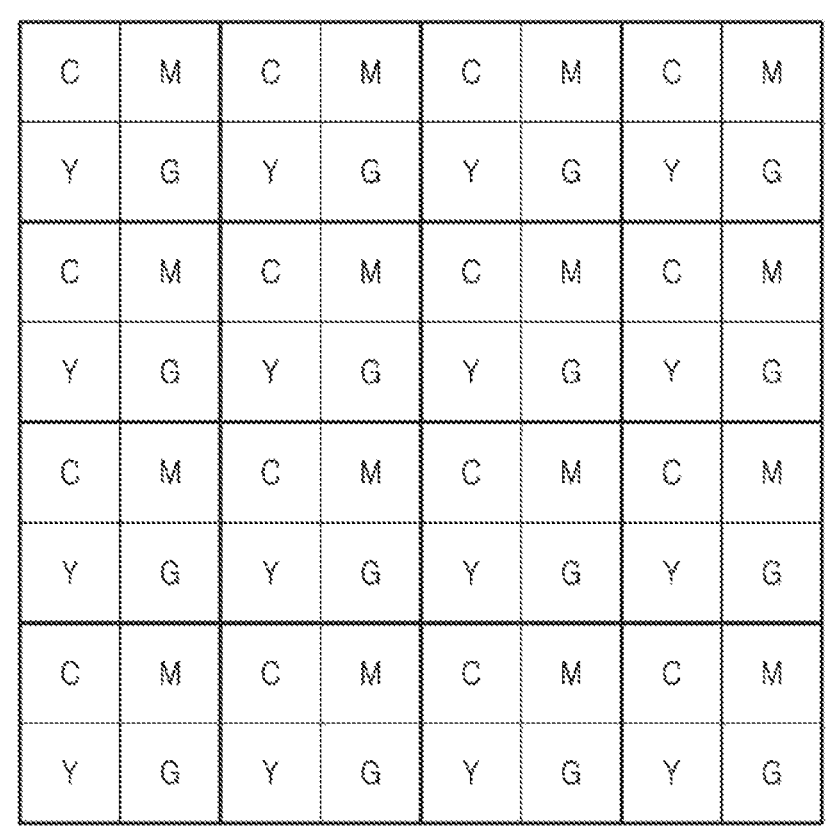

The pixel array 1100 may include a plurality of pixels for sensing light of different wavelengths. The arrangement of the pixels may be implemented in various ways. FIGS. 2A to 2C illustrate various pixel arrangements of the pixel array 1100 of the image sensor 1000 in FIG. 1.

First, FIG. 2A shows the Bayer pattern which is adopted in the image sensor 1000. With reference to FIG. 2A, one unit pattern may include four quadrant regions, and the first quadrant, the second quadrant, the third quadrant, and the fourth quadrant may be a blue pixel B, a green pixel G, a red pixel R, and a green pixel G, respectively. Such unit pattern may be repeatedly arranged in a two-dimensional (2D) manner in a first direction (X direction) and a second direction (Y direction). For example, two green pixels G may be arranged in one diagonal direction in a unit pattern of a 2×2 array, and one blue pixel B and one red pixel R may be arranged in another diagonal direction. As for the overall pixel arrangement, a first column in which a plurality of green pixels G and a plurality of blue pixels B are alternately arranged in the first direction, and a second column in which a plurality of red pixels R and a plurality of green pixels G are alternately arranged in the first direction may be repeatedly arranged along a second direction.

The pixel array 1100 may be arranged in various ways other than the Bayer pattern. For example, with reference to FIG. 2B, the pixel array 1100 may be arranged in a CYGM manner in which a magenta pixel M, a cyan pixel C, a yellow pixel Y, and a green pixel G constitute a unit pattern. Further, with reference to FIG. 2C, the pixel array 1100 also may be arranged in a RGBW manner in which a green pixel G, a red pixel R, a blue pixel B, and a white pixel W constitute a unit pattern. A unit pattern may have a 3×2 array form. In addition, the pixels of the pixel array 1100 may be arranged in various ways according to color characteristics of the image sensor 1000. Although the pixel array 1100 of the image sensor 1000 are described as having the Bayer pattern, the operation principle may be applied to a pixel array other than the Bayer pattern.

Figure 3A:
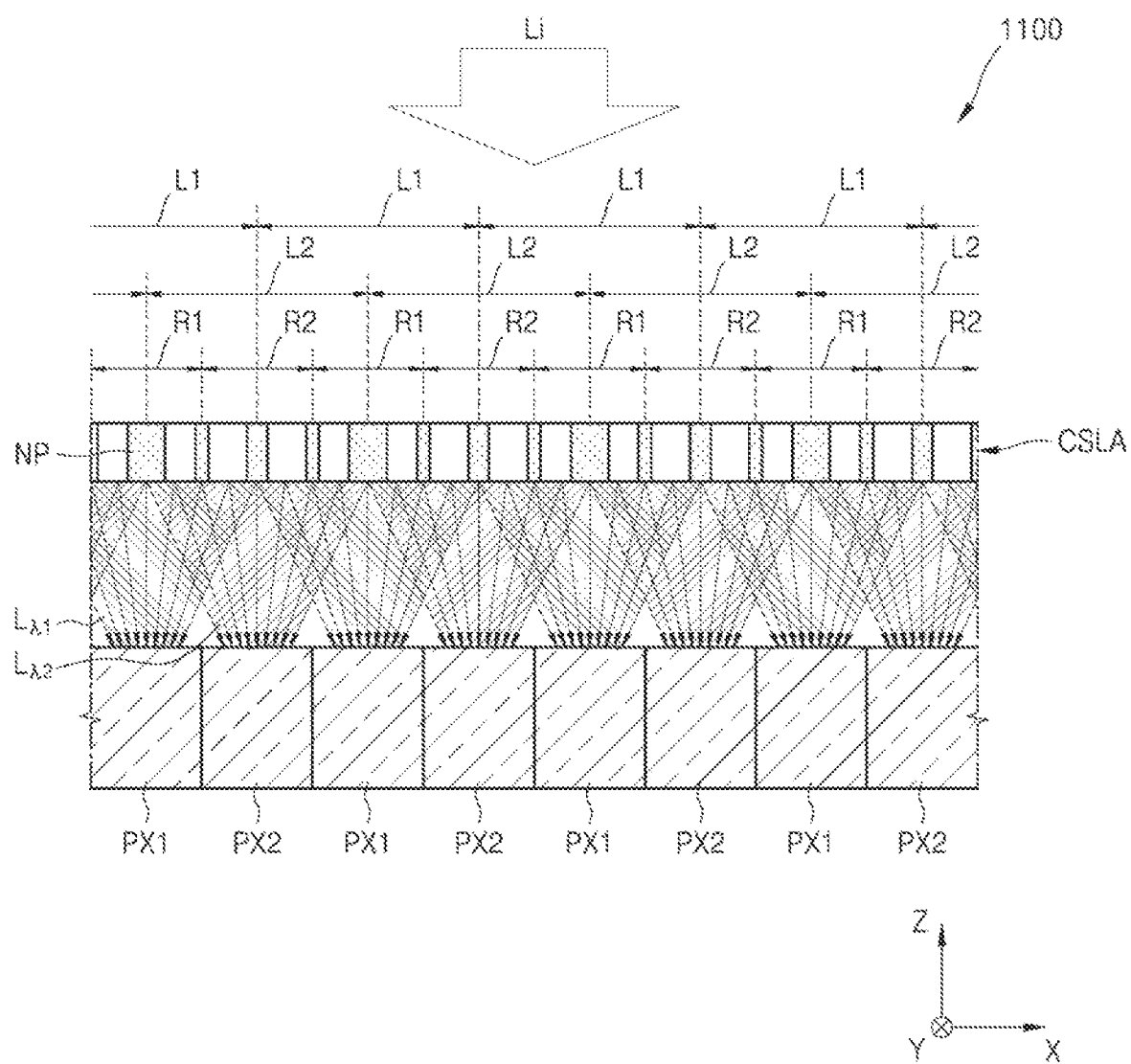
FIGS. 3A and 3B are conceptual diagrams of a structure and operation of a color separating lens array according to an example embodiment.
Figure 3B:
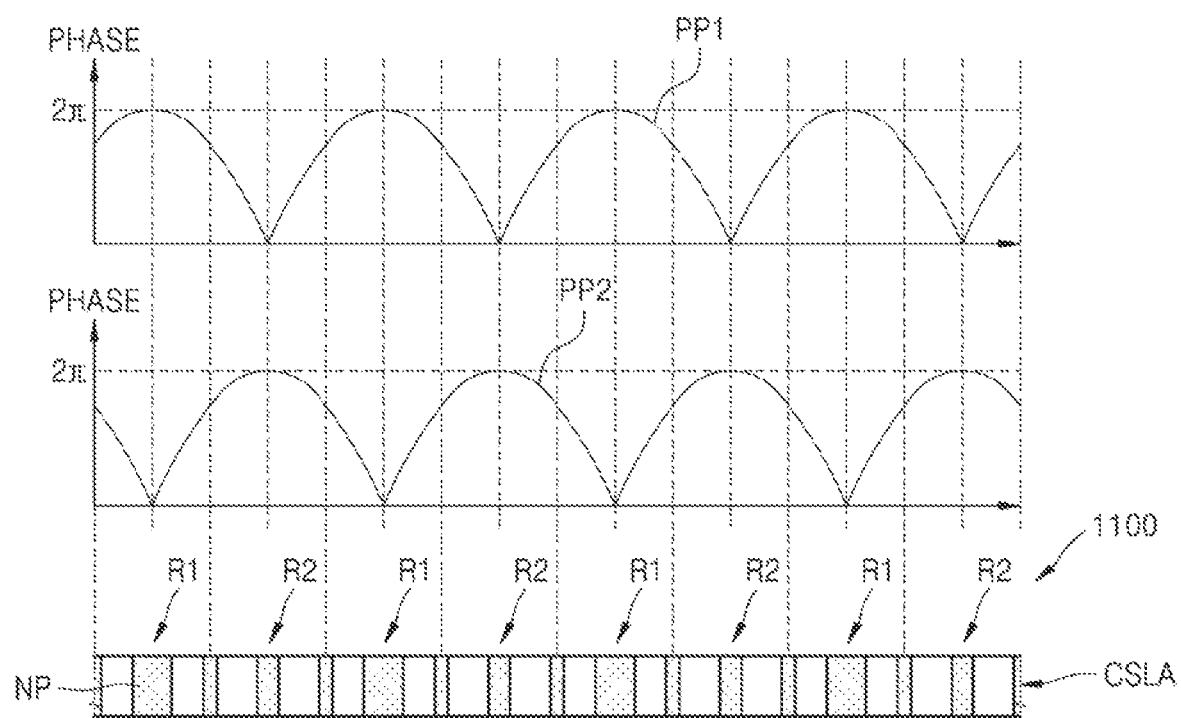

The pixel array 1100 of the image sensor 1000 may include a color separating lens array configured to concentrate light of a certain color corresponding to a particular pixel. FIGS. 3A and 3B are diagrams of a structure and operation of a color separating lens array according to an example embodiment.

With reference to FIG. 3A, a color separating lens array CSLA may include a plurality of nanoposts NP which change the phase of the incident light Li according to an incidence position. The color separating lens array 1100 may be divided in various ways. For example, the color separating lens array 1100 may be divided into a first pixel-corresponding area R1 corresponding to a first pixel PX1, on which light of the first wavelength $L_{\lambda 1}$ included in the incident light Li is incident, and a second pixel-corresponding area R2 corresponding to a second pixel PX2, on which light of the second wavelength $L_{\lambda 2}$ included in the incident light Li is incident. The first and second pixel-corresponding areas R1 and R2 may respectively include one or more nanoposts NP, and be arranged to face the first pixel PX1 and the second pixel PX2, respectively. As another example, the color separating lens array 1100 may be divided into a first-wavelength light concentration area L1 concentrating light of the first wavelength $L_{\lambda 1}$ on the first pixel PX1, a second-wavelength light concentration area L2 concentrating light of the second wavelength $L_{\lambda 2}$ on the second pixel P2. The first-wavelength light concentration area L1 and the second-wavelength light concentration area L2 may partially overlap.

The color separating lens array CSLA may concentrate light of the first wavelength $L_{\lambda 1}$ on the first pixel PX1 and light of the second wavelength $L_{\lambda 2}$ on the second pixel PX2 by forming different phase profiles at the first and second wavelengths lights $L_{\lambda 1}$ and $L_{\lambda 2}$.

For example, with reference to FIG. 3B, at a position right after passing through the color separating lens array CSLA, which is a position of the bottom surface of the color separating lens array CSLA, light of the first wavelength $L_{\lambda 1}$ may have a first phase profile PP1, and light of the second wavelength $L_{\lambda 2}$ may have a second phase profile PP2, which allows light of the first wavelength $L_{\lambda 1}$ and light of the second wavelength $L_{\lambda 2}$ to be concentrated on the corresponding first and second pixels PX1 and PX2, respectively, by the color separating lens array CSLA. For example, light of the first wavelength $L_{\lambda 1}$ passed through the color separating lens array CSLA may have the first phase profile PP1 which is maximized at the center of the first pixel-corresponding area R1, and be reduced in a direction proceeding away from the first pixel-corresponding area R1, which is a direction to the second pixel-corresponding area R2. Such phase profile may be similar to a phase profile of light passing through a micro-lens having a convex center arranged in the first-wavelength light concentration area L1, and converging on one point, and light of the first wavelength $L_{\lambda 1}$ may be concentrated on the first pixel PX1. Further, light of the second wavelength $L_{\lambda 2}$ passed through the color separating lens array CSLA may have the second phase profile PP2 which is maximized at the center of the second pixel-corresponding area R2, and be reduced in a direction proceeding away from the second pixel-corresponding area R2, which is a direction of the first pixel-corresponding area R1, which allows light of the second wavelength $L_{\lambda 2}$ to be concentrated on the second pixel PX2.

As a refractive index of material is different depending on a wavelength of reacting light, as illustrated in FIG. 3B, the color separating lens array CSLA may provide different phase profiles for light of the first wavelength $L_{\lambda 1}$ and light of the second wavelength $L_{\lambda 2}$. For example, as a material may have different refractive indexes according to a wavelength of light reacting to the material, and the phase delay experience by light passed through the material may vary by wavelength, different phase profiles may be formed for each wavelength. For example, as a refractive index of light of the first wavelength $L_{\lambda 1}$ of the first pixel-corresponding area R1 is different than a refractive index of light of the second wavelength $L_{\lambda 2}$ of the first pixel-corresponding area R1, and a phase delay experienced by light of the first wavelength $L_{\lambda 1}$ passed through the first pixel-corresponding area R1 may be different than a phase delay experienced by light of the second wavelength $L_{\lambda 2}$ passed through the first pixel-corresponding area R1, when the color separating lens array CSLA is designed considering such characteristics of light, it may provide different phase profiles for light of the first wavelength $L_{\lambda 1}$ and light of the second wavelength $L_{\lambda 2}$.

The color separating lens array CSLA may include a nanopost NP arranged by a certain rule so that light of the first wavelength $L_{\lambda 1}$ and light of the second wavelength $L_{\lambda 2}$ have the first phase profile PP1 and the second phase profile PP2, respectively. Here, the rule may be applied to parameters of the nanopost NP, such as a shape, size (width, height), interval, arrangement, etc., and such parameters may be determined according to a phase profile to be implemented through the color separating lens array CSLA.

A rule applied to arrangement of nanopost NP in the first pixel-corresponding area R1 and a rule applied to arrangement of nanopost NP in the second pixel-corresponding area R2 may be different. For example, a size, shape, interval and/or arrangement of the nanopost NP provided in the first pixel-corresponding area R1 may be different than those of the nanopost NP provided in the second pixel-corresponding area R2.

The diameter of cross-section of the nanopost NP may have a size of a subwavelength. Here, the subwavelength may refer to a wavelength smaller than a wavelength band of light subject to separation. The nanopost NP, for example, may have the smaller size than whichever shorter wavelength from the first wavelength and the second wavelength. When the incident light Li is visible light, the diameter of the cross-section of the nanopost NP may have a size smaller than, for example, 400 nm, 300 nm, or 200 nm. The height of the nanopost NP may be 500 nm to 1500 nm, and may be greater than the diameter of the cross-section. The nanopost NP may be two or more vertically (the Z direction) stacked posts combined together.

The nanopost NP may include materials having a higher refractive index than peripheral materials. For example, the nanopost NP may include c-Si, p-Si, a-Si and III-V compound semiconductors (gallium phosphide (GaP), gallium nitride (GaN), gallium arsenide (GaAs), etc.), silicon carbide (SiC), titanium oxide (TiO2), silicon nitride (SiN), and/or combinations thereof. The nanopost NP having a different refractive index than peripheral materials may change a phase of light passing the nanopost NP. This is due to a phase delay caused by the shape dimension of a subwavelength of the nanopost NP, and the degree of phase delay may be determined by detailed shape dimension, arrangement, etc. of the nanopost NP. The peripheral material of the nanopost NP may include a dielectric material having a lower refractive index than the nanopost NP. For example, the peripheral material may include silicon oxide (SiO2) or air.

The first wavelength λ1 and the second wavelength λ2 may be the wavelength bands of infrared light and visible light. However, embodiments are not limited thereto, and the first and second wavelengths λ1 and λ2 may operate in various wavelengths according to arrangement rules of the nanopost NP. In addition, although incident light is separated by two wavelengths for concentration, the incident light may be separated in three or more directions according to a wavelength for concentration.

Also, even though some example embodiments describe that the color separating lens array CSLA is a single layer structure, the color separating lens array CSLA may be a structure made of a multiple layers stacked together. For example, the color separating lens array CSLA may be designed to allow a first layer to concentrate visible light on a particular pixel, and a second layer to concentrate infrared light on another pixel.

Figure 4A:
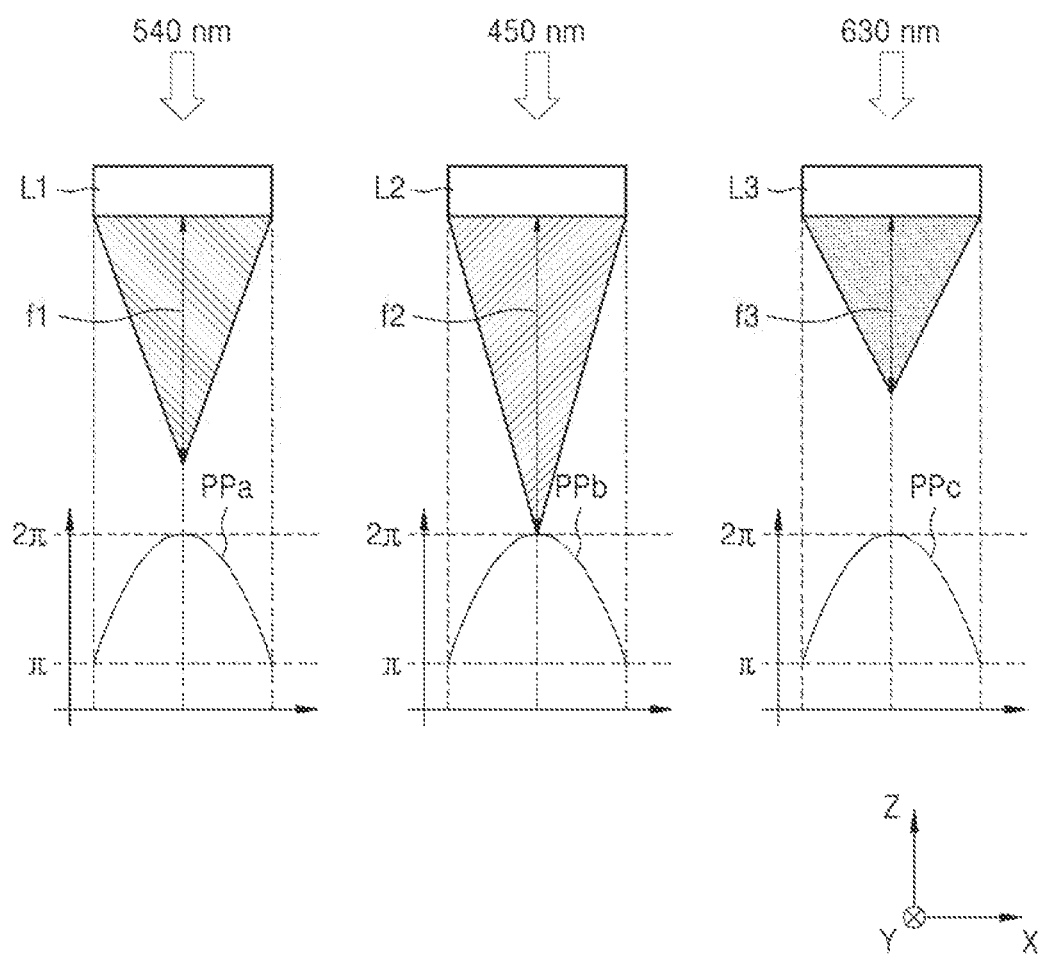
FIGS. 4A and 4B are diagrams illustrating the relationship between wavelength and a phase profile of light and a focal distance.
Figure 4B:
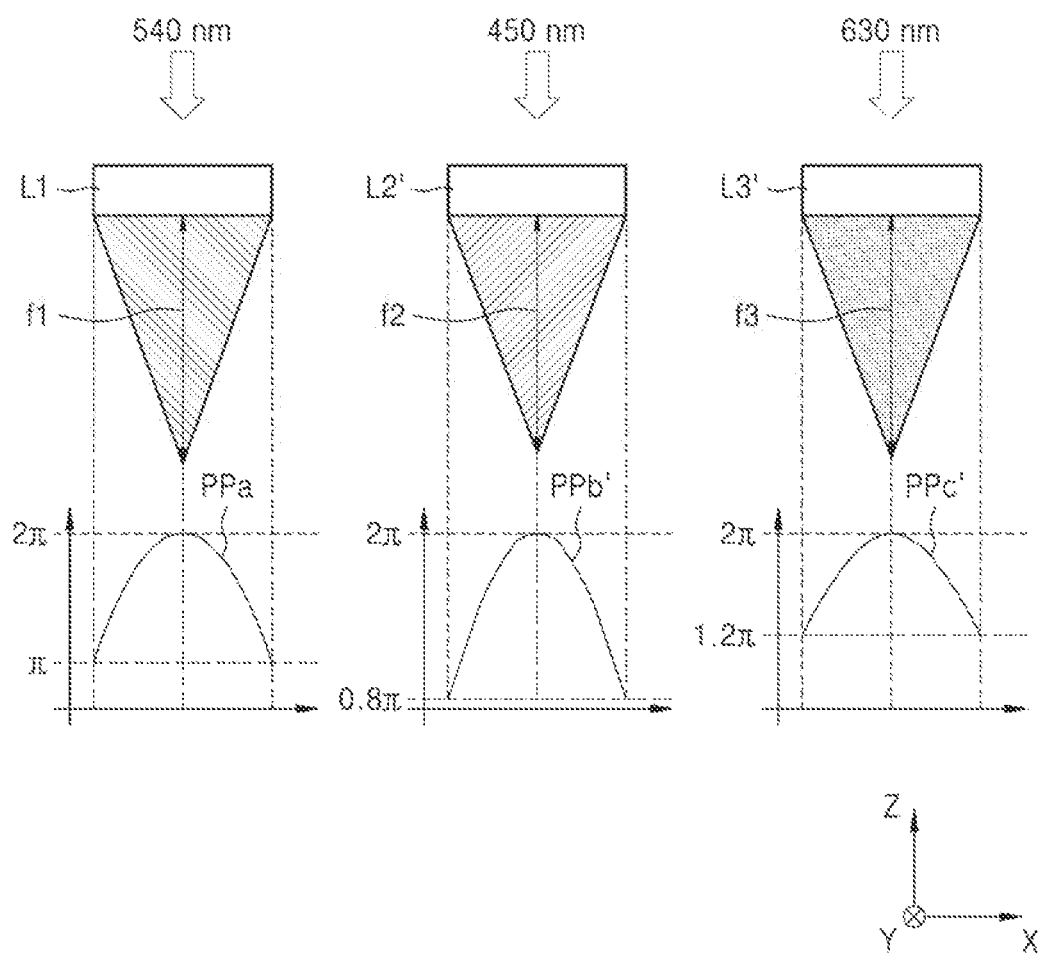

FIGS. 4A and 4B are diagrams for explaining the relationship among a wavelength of light and a phase profile, and a focal distance.

FIG. 4A illustrates a first focal distance f1, a second focal distance f2, and a third focal distance f3 of light of three different wavelengths having the same phase profile. That is, FIG. 4A illustrates focal distances for each wavelength when light of wavelength of 540 nm, 450 nm, and 630 nm have a phase profile having $2\pi$ at the center of each light concentration area L1, L2, and L3, and reducing to $\pi$ in a direction proceeding away from the center, at the position right after passing through the first to third wavelength light concentration areas L1, L2, and L3 of the color separating lens array. Specifically, the 540 nm light may be concentrated at the first focal distance f1 by the first phase profile PPa which reduces from $2\pi$ to $\pi$, the 450 nm light may be concentrated at the second focal distance f2 longer than the first focal distance f1 by the second phase profile PPb, which is the same as the first phase profile PPa, and the 630 nm light may be concentrated at the third focal distance f3 shorter than the first focal distance f1 by the third phase profile PPc, which is the same as the first phase profile PPa. For example, with the same phase profile, the focal distance may be inversely proportional to the wavelength. Accordingly, to allow each concentration area L1, L2, and L3 to have the same focal distance for different wavelengths, the color separating lens array 130 may need to provide a phase profile having a different phase reduction rate in the X direction.

FIG. 4B is a diagram for explaining phase profiles of light concentration areas allowing incident light of different wavelengths to have the same focal distance.

FIG. 4B illustrates phase profiles PPa, PPb', and PPc' of light of three different wavelengths having the same focal distance. A first phase profile PPa of light of 540 mm wavelength of FIG. 4B is as described in FIG. 4A, and light of 540 nm wavelength may have a first focal distance f1.

Light of 450 nm wavelength of FIG. 4B may have a second' focal distance f2' shorter than the second focal length f2 of FIG. 4A. To reduce the focal distance, the second' phase profile PPb' may be greater than the phase reduction rate in the X direction, compared to the second phase profile PPb of FIG. 4A. For example, the second phase profile PPb of FIG. 4A may be $2\pi$ at the center of the second light concentration area L2, and decrease by $\pi$ to $\pi$ in the direction proceeding away from the center, whereas the second' phase profile PPb' of FIG. 4B may be $2\pi$ at the center of the second' light concentration area L2', and decrease by $1.2\pi$ to $0.8\pi$ in the direction proceeding away from the center. As the reduction rate of the second' phase profile PPb' increases, the second' focal distance f2' of the second'-wavelength light concentration area L2' for light of the second wavelength in FIG. 4B may become shorter, and the second' focal distance f2' may be designed to be identical to the first focal distance f1.

Light of 630 nm wavelength of FIG. 4B may have a third' focal distance f3' longer than the third focal length f3 of FIG. 4A. To increase the focal distance, the phase reduction rate at the center of the light concentration area in the X direction may be reduced. For example, the third' phase profile PPc' may have a smaller phase reduction rate than the third phase profile PPc of FIG. 4A. For example, the third phase profile PPc of FIG. 4A may be $2\pi$ at the center of the third light concentration area L3, and decrease by $\pi$ to $\pi$ in the direction proceeding away from the center, whereas the third' phase profile PPc' of FIG. 4B may be $2\pi$ at the center of the third' light concentration area L3', and decrease only by $0.8\pi$ to $1.2\pi$ in the direction proceeding away from the center. As the phase reduction rate of the third' phase profile PPc' is smaller than that of the third phase profile PPc, the third' focal distance f3' of the third' wavelength light concentration area L3' for the third wavelength light of FIG. 4B may become longer, and the third' focal distance f3' may be designed to be identical to the first focal distance f1.

Hereinafter, the pixel array 1100 of the image sensor 1000 employing the color separating lens array may be described in more detail.

Figure 5A:
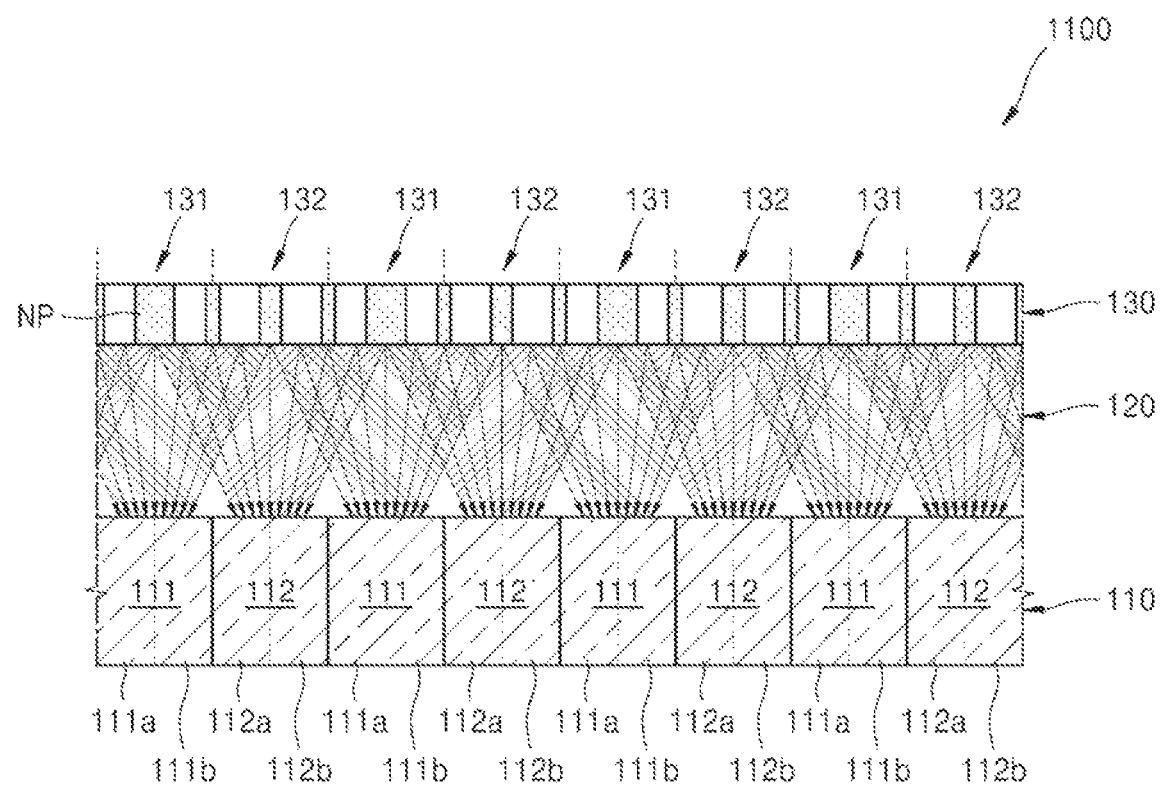
FIGS. 5A and 5B are cross-sectional views of different cross-sections of a pixel array of an image sensor according to an example embodiment.
Figure 5B:
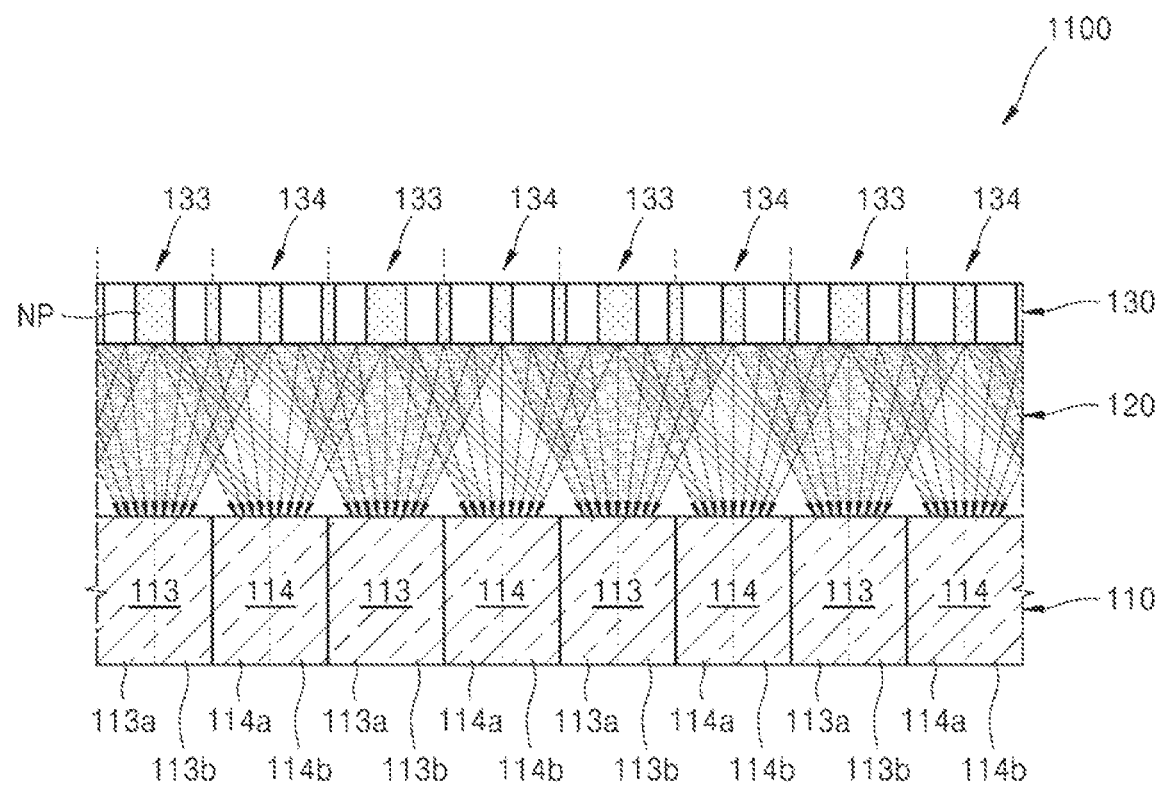
Figure 6A:
FIG. 6A is a planar view of a pixel arrangement in a pixel array.
Figure 6B:
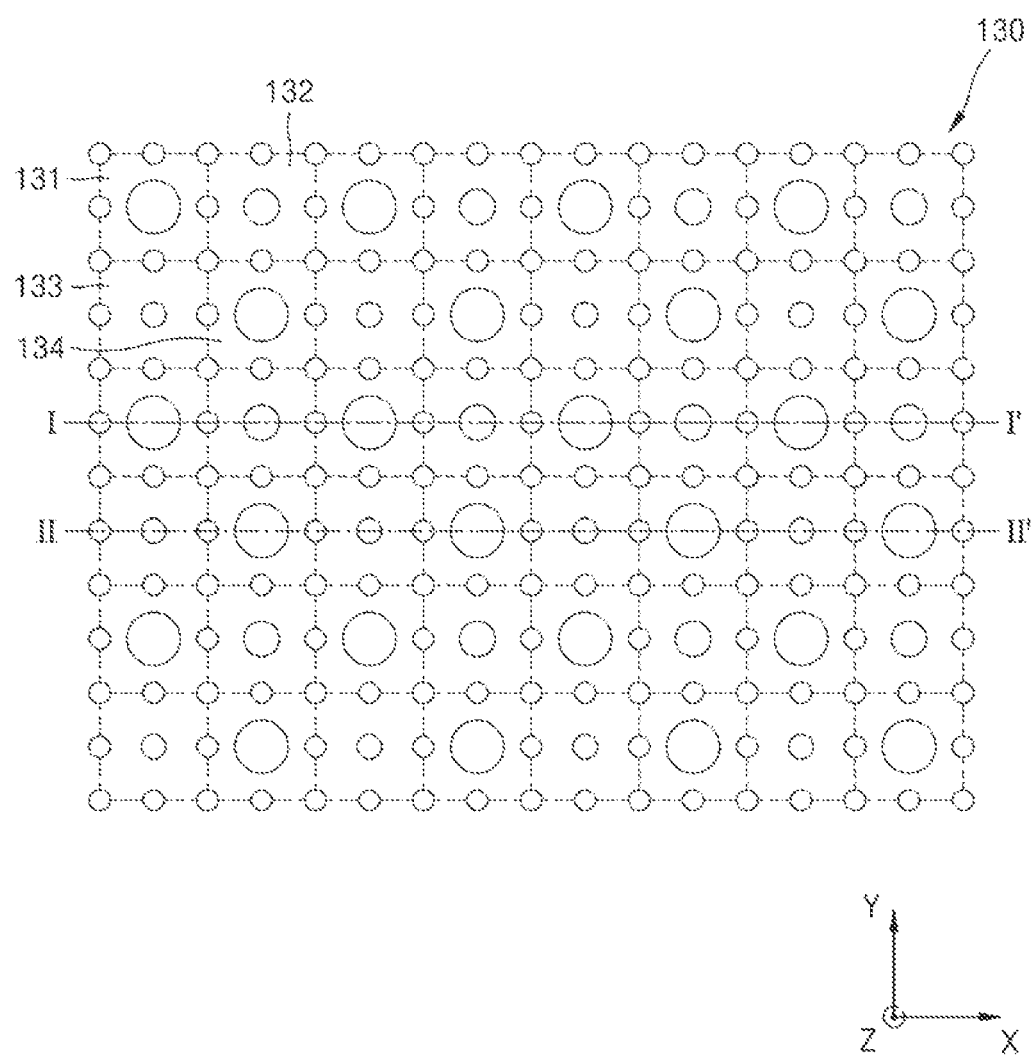
FIG. 6B is a planar view of an example of a plurality of nanoposts arranged in a plurality of areas of a color separating lens array.
Figure 6C:
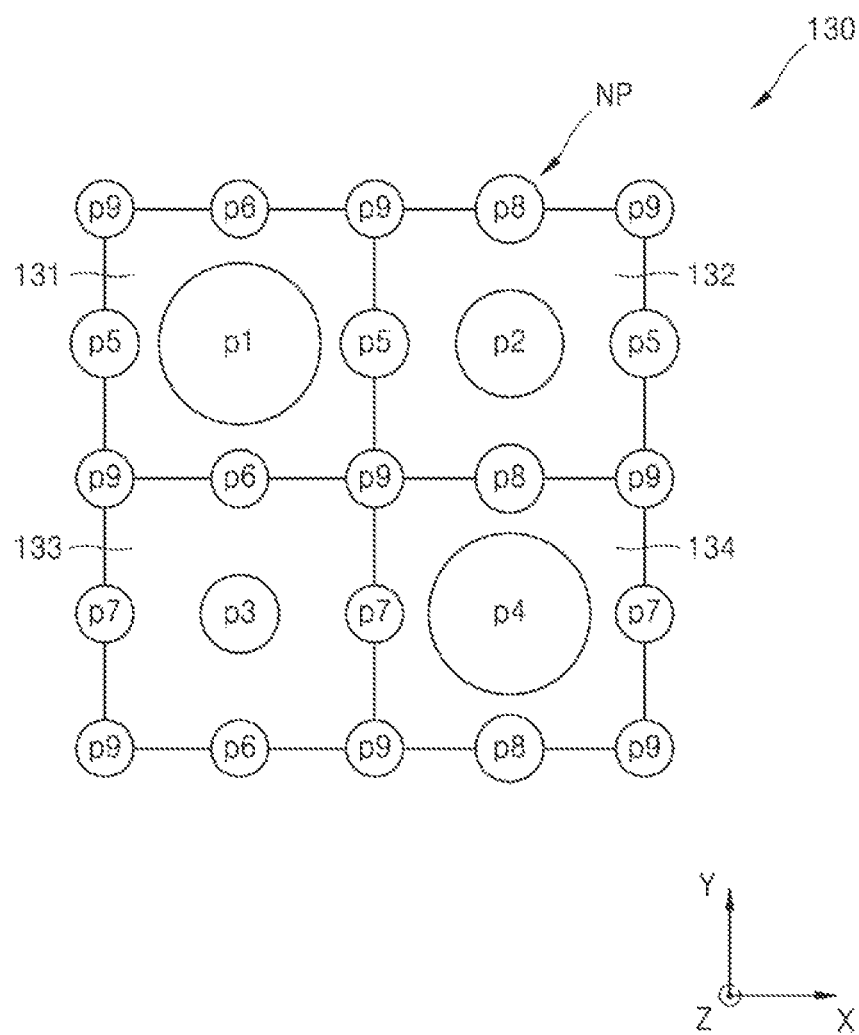
FIG. 6C is a detailed enlarged planar view of part of FIG. 6B.

FIGS. 5A and 5B are cross-sectional views of different cross-sections of a pixel array 1100 of an image sensor 1000 according to an example embodiment, FIG. 6A is a planar view of pixel arrangement in a pixel array 1100 of the image sensor 1000, FIG. 6B is a planar view of an example of a plurality of nanoposts arranged in a plurality of areas of a color separating lens array in the pixel array 1100 of the image sensor 1000, and FIG. 6C is a detailed planar view of partially enlarged FIG. 6B.

With reference to FIGS. 5A and 5B, a pixel array 1100 of the image sensor 1000 may include a sensor substrate 110 including a plurality of pixels 111, 112, 113, and 114, a transparent spacer layer 120 arranged on the sensor substrate 110, and a color separating lens array 130 arranged on the spacer layer 120.

The sensor substrate 110 may include a first green pixel 111, a blue pixel 112, a red pixel 113, and a second green pixel 114. The first green pixel 111 and the blue pixel 112 may be arranged alternately in the first direction (the X direction), and as shown in FIG. 5B, in the cross-section of different Y direction, the red pixel 113 and the second green pixel 114 may be arranged alternately. FIG. 6A illustrates arrangement of pixels when the pixel array 1100 of the image sensor 1000 have the Bayer pattern as in FIG. 2A. Such arrangement may be intended to separate incident light into unit patterns, such as the Bayer pattern for sensing. For example, the first and second green pixels 111 and 114 may sense green light, the blue pixel 112 may sense blue light, and the red pixel 113 may sense red light. A separation film for separation of cells may be further formed at boundaries between the cells.

With reference to FIG. 6A, all or some of the first green pixel 111, the blue pixel 112, the red pixel 113, and the second green pixel 114 may include two or more light sensing cells, and pixels including the two or more light sensing cells may be auto focusing pixels. A logic circuit of the image sensor 1000 may implement the auto focusing function of the image sensor 1000 and/or a camera device including the image sensor 1000 by using a difference between signals obtained from each light sensing cell included in the auto focusing pixels. The auto focusing pixels may include an inner-pixel separation film for separation of the light sensing cells to accurately calculate the difference between output signals of two or more light sensing cells included in one pixel. As the light sensing cells may be separated by the inner-pixel separation film, separate signals may be output. The example embodiments of FIGS. 5A and 5B describe the case where all of the green, blue, and red pixels 111, 112, 113, and 114 include two light sensing cells, i.e., the first green pixel 111 includes green light sensing cells 111a and 111b, the blue pixel 112 includes a first blue light sensing cell 112a and a second blue light sensing cell 112b, the red pixel 113 includes a first red light sensing cell 113a and a second red light sensing cell 113b, and the second green pixel 114 includes green light sensing cells 114a and 114b.

The spacer layer 120 may be arranged between the sensor substrate 110 and the color separating lens array 130 to maintain a constant distance between the sensor substrate 110 and the color separating lens array 130. The spacer layer 120 may include a dielectric material having a lower refractive index for materials transparent in visible light lower than the nanopost NP, such as SiO2, siloxane-based spin on glass, etc., and low absorption rate in visible light band. The thickness h of the spacer layer 120 may be selected within the range of ht−p≤h≤ht+p. Here, the theoretical thickness ht of the spacer layer 120 may be represented by the following [Equation 1] when n represents the refractive index of the spacer layer 120 for the wavelength $\lambda 0$, and p represents the pitch of the pixel.

$$h_t = \frac{np^2}{\lambda_0} - \frac{\lambda_0}{4n} \quad \text{[Equation 1]}$$

The theoretical thickness ht of the spacer layer 120 may refer to a focal distance at which light having the wavelength of $\lambda 0$ is concentrated on the top surface of the pixels 111, 112, 113, and 114. $\lambda 0$ may be a reference wavelength to determine the thickness h of the spacer layer 120, and for example, the thickness of the spacer layer 120 may be designed based on the wavelength of green light, i.e., 540 nm.

The color separating lens array 130 may include nanoposts NP which are supported by the spacer layer 120 and change a phase of incident light, and dielectric material disposed between the nanoposts NP and having a lower refractive index than the nanopost NP, such as air or SiO2.

With reference to FIG. 6B, the color separating lens array 130 may be divided into four area 131, 132, 133, and 134 corresponding to each pixel 111, 112, 113, and 114 of FIG. 6A. The first green pixel-corresponding area 131 may correspond to the first green pixel 111 and may be arranged on the top of the first green pixel 111, the blue pixel-corresponding area 132 may correspond to the blue pixel 112, and may be arranged on the top of the blue pixel 112, the red pixel-corresponding area 133 may be arranged on the red pixel 113, and may be arranged on the top of the red pixel 113, and the second green pixel-corresponding area 134 may correspond to the second green pixel 114, and may be arranged on the second green pixel 114. For example, the pixel-corresponding area 131, 132, 133, and 134 of the color separating lens array 130 may be arranged to face each pixel 111, 112, 113, and 114 of the sensor substrate 110. The pixel-corresponding areas 131, 132, 133, and 134 may be arranged in a 2D manner in the first direction (the X direction) and the second direction (the Y direction) so that a first row in which the first green pixel-corresponding area 131 and the blue pixel-corresponding area 132 are arranged alternately and a second row in which the red pixel-corresponding area 133 and the second green pixel-corresponding area 134 are arranged alternately are arranged alternately. The color separating lens array 130 may include a plurality of unit patterns arranged in a 2D manner as in the sensor substrate 110, and each unit pattern may include pixel-corresponding areas 131, 132, 133, and 134 arranged in the form of 2×2.

However, embodiments are not limited thereto. For example, the color separating lens array 130 may be divided into a green light concentration area concentrating green light, a blue light concentration area concentrating blue light, and a red light concentration area concentrating red light.

The color separating lens array 130 may include nanoposts NP of which size, shape, interval, and/or arrangement has been determined so that green light is separated and concentrated on the first and second green pixels 111 and 114, blue light is separated and concentrated on the blue pixel 112, and red light is separated and concentrated on the red pixel 113. The thickness (in the Z direction) of the color separating lens array 130 may be similar to the height of the nanopost NP, and may be 500 nm to 1500 nm.

With reference to FIG. 6B, the pixel-corresponding areas 131, 132, 133, and 134 may include cylindrical nanoposts NP having a circular cross-section, and nanoposts NP having different cross-sectional areas may be arranged at the center of each area. Further, nanoposts NP may be arranged at the center on the boundaries between the pixels, and the cross points of boundaries between the pixels. The nanopost NP arranged on the boundary between pixels may have a smaller cross-sectional area than the nanopost NP arranged at the center of the pixel.

FIG. 6C illustrates in detail arrangement of the nanoposts NP included in the pixel-corresponding areas 131, 132, 133, and 134 constituting the unit pattern. In FIG. 6C, the nanoposts NP are denoted as P1 to P9 according to their position. Referring to FIG. 6C, the cross-sectional area of, among the nanoposts NP, a nanopost p1 arranged at the center of the first green pixel-corresponding area 131 and a nanopost p4 arranged at the center of the second green pixel-corresponding area 134 may be greater than that of a nanopost p2 arranged at the center of the blue pixel-corresponding area 132 or of a nanopost p3 arranged at the center of the red pixel-corresponding area 133, and the cross-sectional area of the nanopost p2 arranged at the center of the blue pixel-corresponding area 132 may be greater than the nanopost p3 arranged at the center of the red pixel-corresponding area 133. However, embodiments are not limited thereto. For example, nanoposts NP of various shapes, sizes, and arrangements may be applied as needed.

The nanoposts NP provided in the first and second green pixel-corresponding areas 131 and 134 may have different profile rules in the first direction (the X direction) and the second direction (the Y direction). For example, the nanoposts NP arranged in the first and second green pixel-corresponding areas 131 and 134 may have different size arrangement in the first direction (the X direction) and the second direction (the Y direction). As shown in FIG. 6C, the cross-sectional area of, among the nanoposts NP, a nanopost p5 arranged on the boundary of the blue pixel-corresponding area 132 adjacent to the first green pixel-corresponding area 131 in the first direction (the X direction) is different than that of a nanopost p6 arranged on the boundary of the red pixel-corresponding area 133 adjacent to the first green pixel-corresponding area 131 in the second direction (the Y direction). Similarly, the cross-sectional area of, among the nanoposts NP, a nanopost p7 arranged on the boundary of the red pixel-corresponding area 133 adjacent to the second green pixel-corresponding area 134 in the first direction (the X direction) is different than that of a nanopost p8 arranged on the boundary of the blue pixel-corresponding area 132 adjacent to the second green pixel-corresponding area 134 in the second direction (the Y direction).

The nanoposts NP arranged in the blue pixel-corresponding area 132 and the red pixel-corresponding area 133 may have a symmetrical profile rule in the first direction (the X direction) and the second direction (the Y direction). As shown in FIG. 6C, the cross-sectional area of, among the nanoposts NP, the nanopost p5 arranged on the boundary between the pixels adjacent to the blue pixel-corresponding area 132 in the first direction (the X direction) is identical to that of the nanopost p8 arranged on the boundary between the pixels adjacent the in the second direction (the Y direction). Further, in the red pixel-corresponding area 133, the cross-sectional area of the nanopost p7 arranged on the boundary between the pixels adjacent in the first direction (the X direction) is identical to that of the nanopost p6 arranged on the boundary between the pixels adjacent in the second direction (the Y direction).

Nanoposts p9 arranged at four corners of each pixel-corresponding area 131, 132, 133, and 134, i.e., the cross points of the four areas may have the same cross-sectional area.

This profile is due to the pixel array of the Bayer pattern. Both of the blue pixel 112 and the red pixel 113 may have the same neighboring pixels, for example, the green pixels 111 and 114 in the first direction (the X direction and the second direction (the Y direction), whereas the first green pixel 111 may have two different neighboring pixels, for example, the blue pixel 112 adjacent in the first direction (X direction) and the red pixel 113 adjacent in the second direction (Y direction), and the second green pixel 114 may have two different neighboring pixels, for example, the red pixel 113 adjacent in the first direction (X direction) and the blue pixel 112 adjacent in the second direction (Y direction). Further, pixels adjacent to the first and second green pixels 111 and 114 in four diagonal directions may be green pixels, and pixels adjacent to the blue pixel 112 in four diagonal directions may be the red pixel 113, and pixels adjacent to the red pixel 113 in four diagonal directions may be the blue pixel 112. Therefore, in the blue and red pixel-corresponding area 132 and 133 corresponding to the blue pixel 112 and the red pixel 113, respectively, the nanoposts NP may be arranged in the form of 4-fold symmetry, and in the first and second green pixel-corresponding area 131 and 134, the nanoposts NP may be arranged in the form of 2-fold symmetry. In particular, the first and second green pixel-corresponding area 131 and 134 may be rotated 90 degrees from each other.

The nanoposts NP of FIGS. 6B and 6C are described as having a symmetrical circular cross-sectional shape, but some nanoposts having an asymmetrical cross-sectional shape may be included. For example, a nanopost of an asymmetrical cross-sectional shape having different widths in the first direction (the X direction) and the second direction (the Y direction) may be employed in the first and second green pixel-corresponding areas 131 and 134, a nanopost of a symmetrical cross-sectional shape having the same width both in the first direction (the X direction) and the second direction (the Y direction) may be employed in the blue and red pixel-corresponding areas 132 and 133.

The arrangement rules of the nanopost NP described above are provided as an example, and are not limited to the illustrated patterns.

Figure 7A:
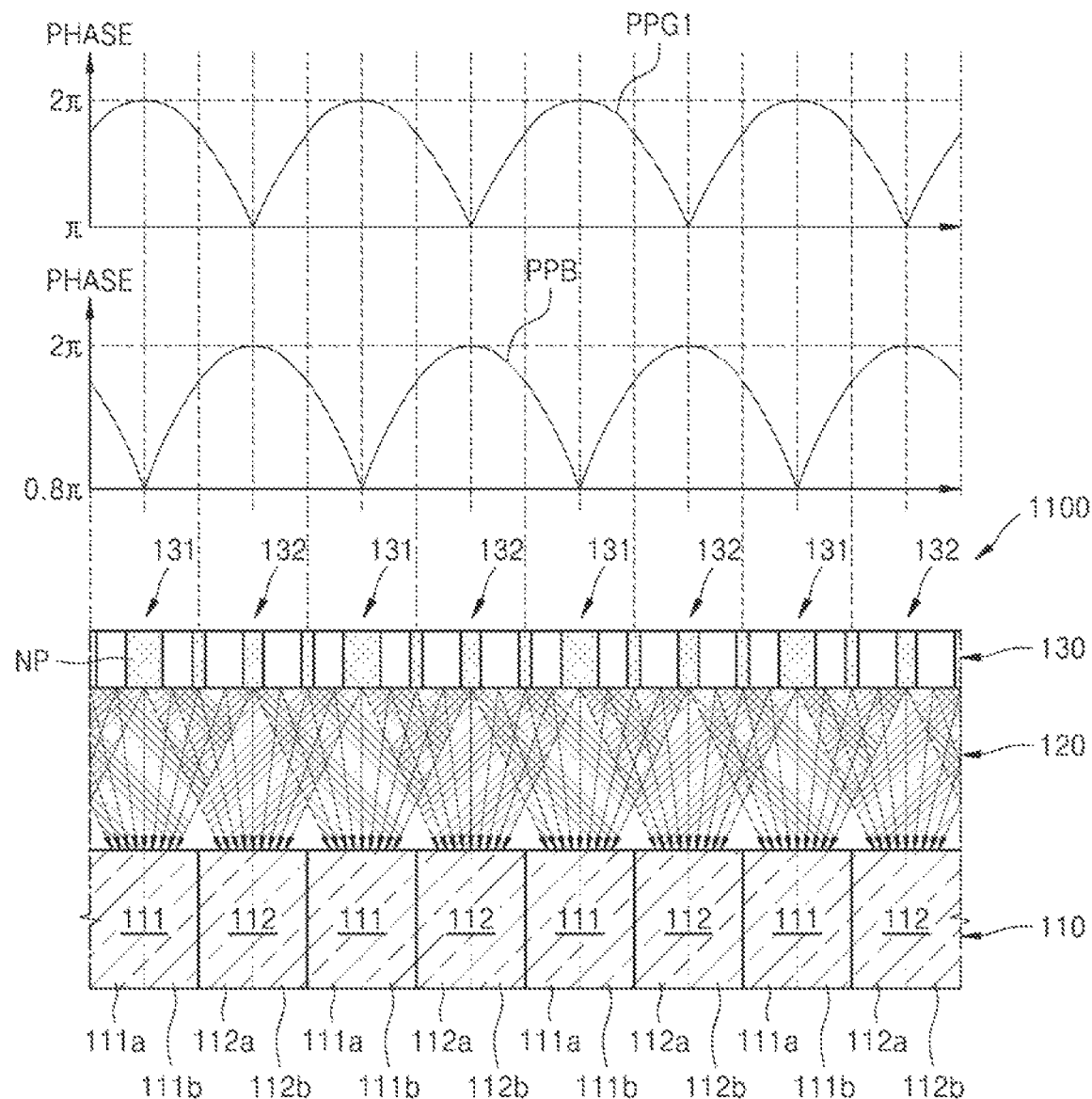
FIG. 7A shows phase profiles of green light and blue light passed through a color separating lens array along line I-I' of FIG. 6B.
Figure 7B:
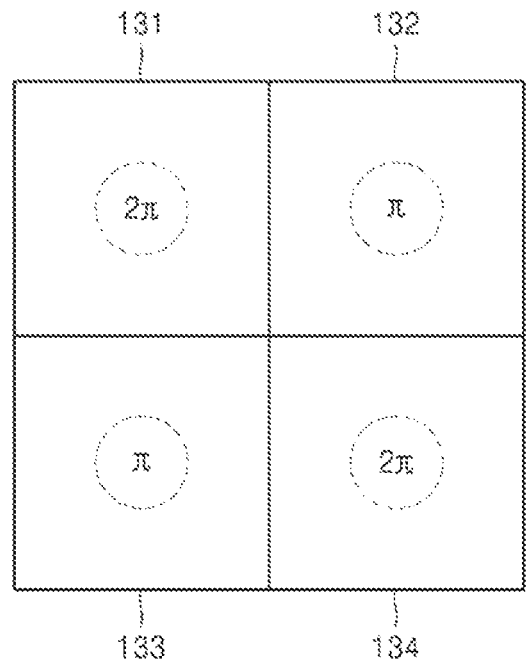
FIG. 7B shows a phase of green light passed through a color separating lens array at the centers of pixel-corresponding areas.
Figure 7C:
FIG. 7C shows a phase of blue light passed through a color separating lens array at the centers of pixel-corresponding areas.

FIG. 7A shows phase profiles of green light and blue light passed through the color separating lens array 130 along the line I-I' of FIG. 6B, FIG. 7B shows a phase of green light passed through the color separating lens array 130 at the centers of pixel-corresponding areas 131, 132, 133, and 134, and FIG. 7C shows a phase of blue light passed through the color separating lens array 130 at the centers of the pixel-corresponding areas 131, 132, 133, and 134. The phase profile of the green light and blue light of FIG. 7A may be similar to the phase profile of light of the first and second wavelength described in FIG. 3B.

With reference to FIGS. 7A and 7B, the green light passed through the color separating lens array 130 may have a phase profile maximized at the center of the first green pixel-corresponding area 131 and reducing in a direction proceeding away from the center of the first green pixel-corresponding area 131. For example, at a position right after light has passed the color separating lens array 130, which is at the bottom surface of the color separating lens array 130 or the top surface of the spacer layer 120, the phase of green light may be maximized at the center of the first green pixel-corresponding area 131, and gradually decrease in the shape of concentric circle in a direction proceeding away from the center of the first green pixel-corresponding area 131 to be minimized at the center of the blue and red pixel-corresponding areas 132 and 133 in the X direction and the Y direction, and at the cross point of the first and second green pixel-corresponding areas 131 and 134 in a diagonal direction. When the phase of the green light emitted from the center of the first green pixel-corresponding area 131 is $2\pi$, light having a phase of $0.9\pi$ to $1.1\pi$ may be emitted from the center of the blue and red pixel-corresponding areas 132 and 133, light of a phase of $2\pi$ may be emitted from the center of the second green pixel-corresponding area 143, and light of a phase of $1.1\pi$ to $1.5\pi$ may be emitted from the cross point between the first green pixel-corresponding area 131 and the second green pixel-corresponding area. The first green light phase profile PPG1 may not indicate that the phase delay amount of light passed through the center of the first green pixel-corresponding area 131 is the greatest, and when the phase of the green light emitted from the center of the first green pixel-corresponding area 131 is $2\pi$, and the phase delay of light traveled through other positions may have a greater value, for example, greater than $2\pi$, the phase delay value by the other position may be a profile of values obtained by subtracted of $2\pi$, for example, a profile of wrapped phase. For example, when the phase of light passed through the first green pixel-corresponding area 131 is $2\pi$, and the phase of light passed through the center of the blue pixel-corresponding area 132 is $3\pi$, the phase of light at the blue pixel-corresponding area 132 may be $\pi$ obtained by subtracting $2\pi$ from $3\pi$ (if n=1).

With reference to FIGS. 7A and 7B, the blue light passed through the color separating lens array 130 may have a phase profile maximized at the center of the blue pixel-corresponding area 132 and decrease in a direction proceeding away from the center of the blue pixel-corresponding area 132. For example, at a position right after light has passed the color separating lens array 130, the phase of blue light may be maximized at the center of the blue pixel-corresponding area 132, and gradually decrease in the shape of concentric circle in a direction proceeding away from the center of the blue pixel-corresponding area 132 to be minimized at the center of the first and second green pixel-corresponding areas 131 and 134 in the X direction and the Y direction, and at the center of the red pixel-corresponding area 133 in a diagonal direction. When the phase of the blue light at the center of the blue pixel-corresponding area 132 is $2\pi$, the phase at the center of the first and second green pixel-corresponding area 131 and 134 may be, for example, $0.5\pi$ to $0.9\pi$, and the phase at the center of the red pixel-corresponding area 133 may be a value smaller than the phase at the center of the first and second green pixel-corresponding areas 131 and 134, for example, $0.2\pi$ to $0.8\pi$.

The phase profile PPB of the blue light is different from the first phase profile PPG1 of the green light as described above, and the reason is that the color separating lens array 130 is designed to allow the focal distance of the blue light by the color separating lens array 130 to be similar to the focal distance of the green light as described with reference to FIGS. 3A and 3B. When the thickness of the spacer layer 120 is determined based on the focal distance of the green light, by adjusting the focal distance of the blue light to be similar to the focal distance of the green light, the blue light and the green light may be concentrated at the same distance, and accordingly, the auto focusing function may be improved when the blue pixel 112 is an auto focusing pixel including two or more light sensing cells. The adjusted focal distance of the blue light may be 90% to 110% or 95% to 105% of the focal distance of the green light.

When comparing the first phase profile PPG1 of the green light and the phase profile PPB of the blue light, the phase difference between the phase of the green light traveled through the center of the first green pixel-corresponding area 131 and the phase of the green light passed traveled through the center of the blue pixel-corresponding area 132 may be smaller than the phase difference between the phase of the blue light traveled through the center of the blue pixel-corresponding area 132 and the phase of the blue light passed traveled through the center of the first green pixel-corresponding area 131 by, for example, $0.1\pi$ to $0.6\pi$.

For example, the phase profile PPG1 of the green light by the color separating lens array 130 and the phase profile PPB of the blue light may be different, and the phase reduction rate for the blue light in the X direction may be greater than the phase reduction rate of the green light in the X direction.

Further, a phase difference between the green light traveled through the center of the first green pixel-corresponding area 131, and the green light traveled through the center of the blue pixel-corresponding area 132 may be 60% to 90% of a phase difference between the blue light traveled through the center of the blue pixel-corresponding area 132, and blue light traveled through the center of the first green pixel-corresponding area 131.

Figure 7D:
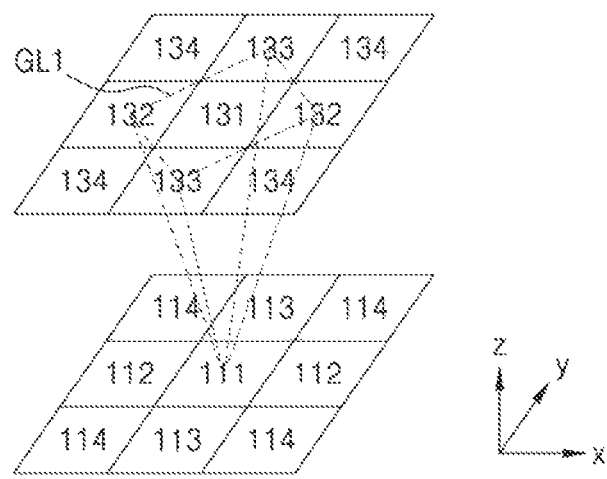
FIG. 7D illustrates an example of a proceeding direction of green light incident on a first green light concentration area.
Figure 7E:
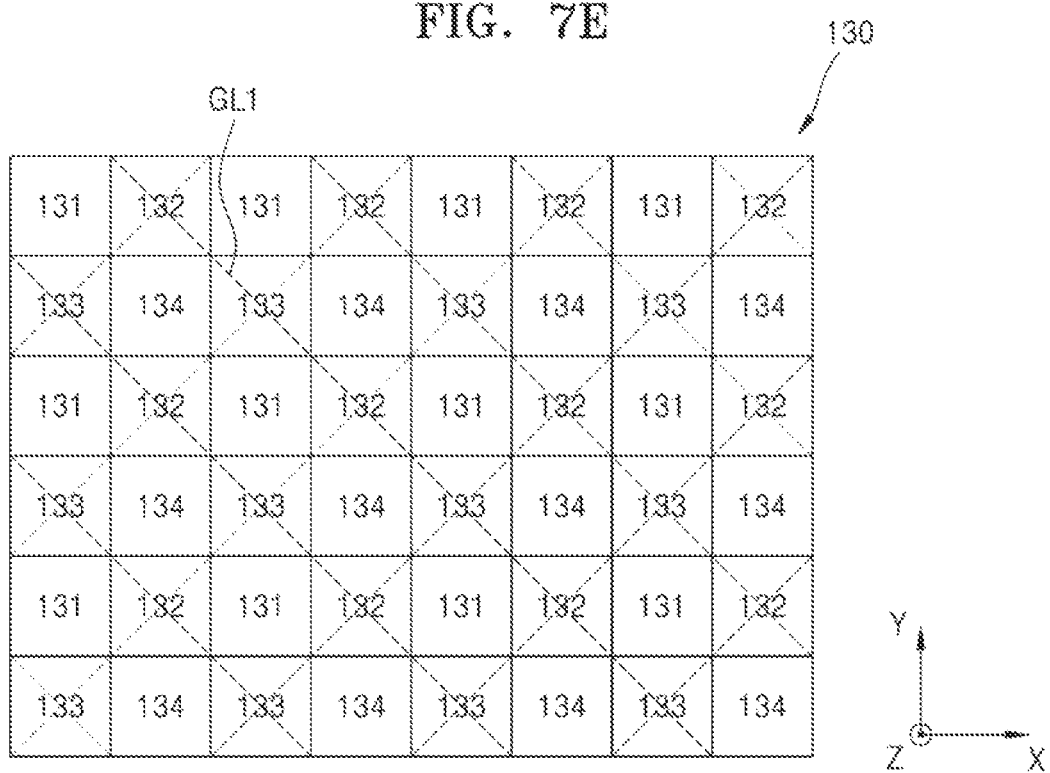
FIG. 7E is a diagram of an example of an array of a first green light concentration area.

FIG. 7D illustrates an example of a proceeding direction of green light incident on a first green light concentration area, and FIG. 7E is a diagram of an example of an array of a first green light concentration area.

The green light incident on the periphery of the first green pixel-corresponding area 131 may be concentrated on the first green pixel 111 by the color separating lens array 130, as shown in FIG. 7D, and the green light from the blue and red pixel-corresponding areas 132 and 133, in addition to the first green pixel-corresponding area 131, may be incident on the first green pixel 111. For example, according to the phase profile of the green light described with reference to FIGS. 7A and 7B, the green light passed through the first green light concentration area GL1 connecting the center of the two blue pixel-corresponding areas 132 and the center of the two red pixel-corresponding area 133, which are adjacent to the first green pixel-corresponding area 131 by engaging one side of each area, may be concentrated on the first green pixel 111. Therefore, the color separating lens array 130 may operate as an array of a first green light concentration area GL1 concentrating green light to the first green pixel 111 as shown in FIG. 7E. The first green light concentration area GL1 may be, for example, 1.2 to 2 times greater than the corresponding first green pixel 111.

Figure 7F:
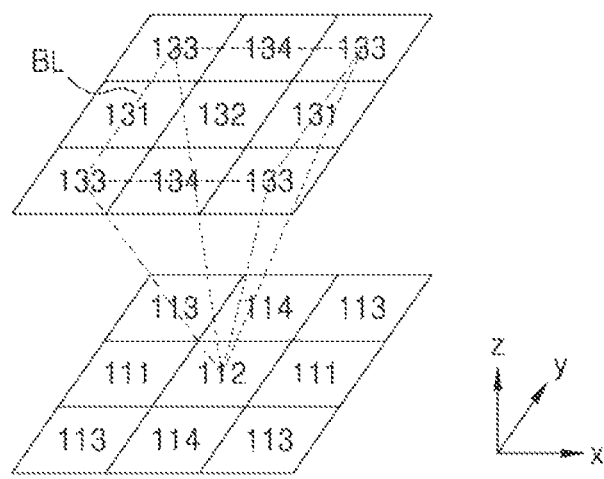
FIG. 7F illustrates an example of a proceeding direction of blue light incident on a blue light concentration area.
Figure 7G:
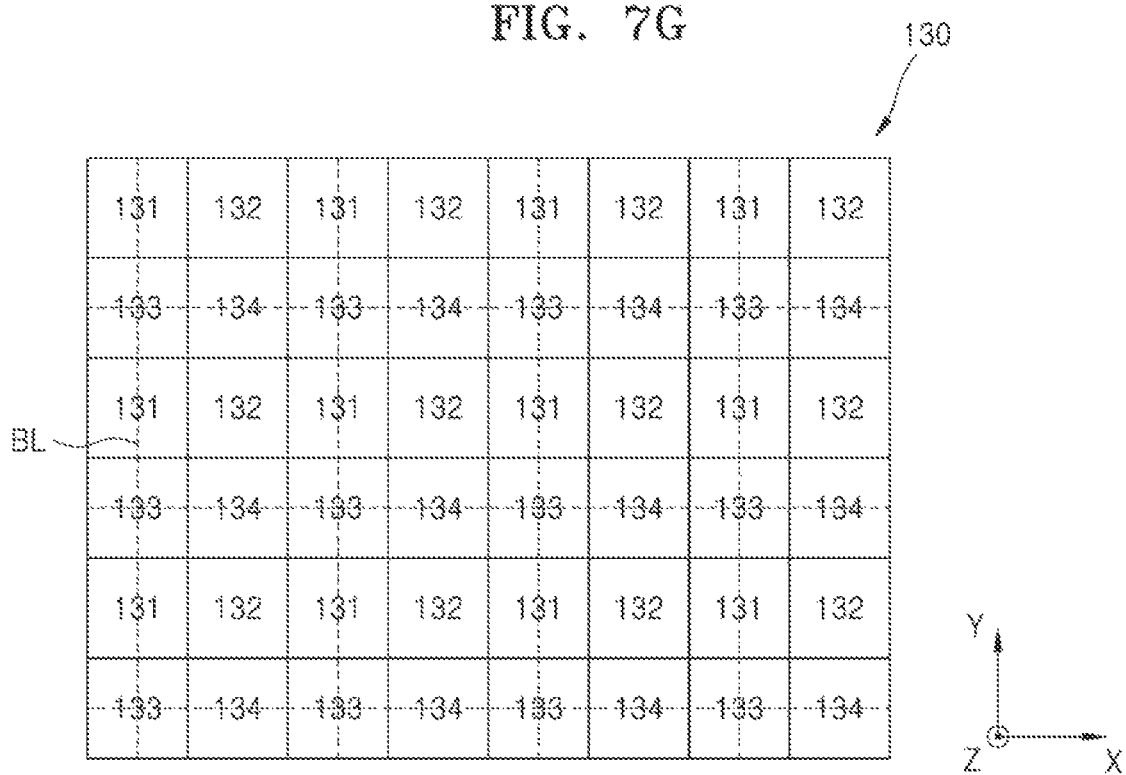
FIG. 7G is a diagram of an example of an array of a blue light concentration area.

FIG. 7F illustrates an example of a proceeding direction of blue light incident on a blue light concentration area, and FIG. 7G is a diagram of an example of an array of a blue light concentration area.

The blue light may be concentrated to the blue pixel 112 by the color separating lens array 130 as described in FIG. 7F, and blue light from the pixel-corresponding areas 131, 132, 133, and 134 may be incident on the blue pixel 112. For example, according to the phase profile of the blue light described with reference to FIGS. 7A and 7C, the blue light passed through the blue light concentration area BL connecting the center of the four red pixel-corresponding areas 133, which are adjacent to the blue pixel-corresponding area 132 by engaging their vertexes, may be concentrated on the blue pixel 112. Therefore, the color separating lens array 130 may operate as an array of a blue light concentration area BL concentrating blue light to the blue pixel 112 as shown in FIG. 7G. The blue light concentration area BL may be, for example, 1.5 to 4 times greater than the corresponding blue pixel 112. Parts of the blue light concentration area BL may overlap the first and second green light concentration areas GL1 and GL2 and the red light concentration area RL.

When comparing the phase profile of the green light passed through the first green light concentration area GL1 and the phase profile of the blue light passed through the blue light concentration area BL, the phase difference between the green light traveled through the center of the first green light concentration area GL1 and the green light traveled through a position spaced apart from the center of the first green light concentration area GL1 by a pixel pitch of the sensor substrate, for example, the center of the blue pixel-corresponding area 132 may be smaller than the phase difference between the blue light traveled through the center of the blue light concentration area BL and the blue light traveled through a position spaced apart from the center of the blue light concentration area BL by a pixel pitch of the sensor substrate, for example, the center of the first green pixel-corresponding area 131. Similarly, the phase difference between the green light traveled through the center of the first green light concentration area GL1 and the green light traveled through a position spaced apart from the center of the first green light concentration area GL1 by ½ of a pixel pitch of the sensor substrate 110, for example, the center of the tangent line of the first green pixel-corresponding area 131 and the blue pixel-corresponding area 132 may be smaller than the phase difference between the blue light traveled through the center of the blue light concentration area BL and the blue light traveled through a position spaced apart from the center of the blue light concentration area BL by ½ of a pixel pitch of the sensor substrate 110, for example, the center of the tangent line of the first green pixel-corresponding area 131 and the blue pixel-corresponding area 132.

Figure 8A:
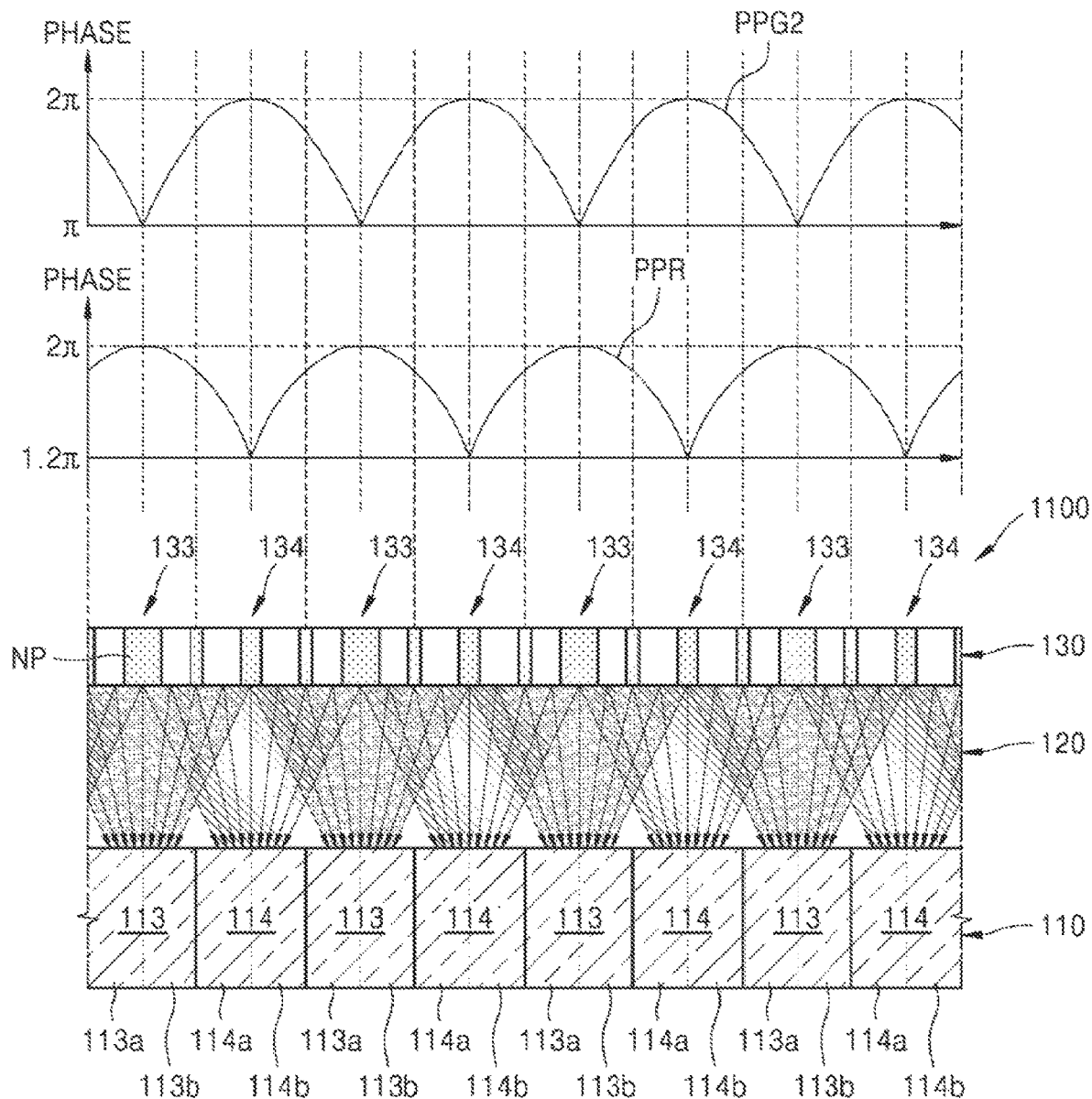
FIG. 8A shows phase profiles of red light and green light passed through a color separating lens array along line II-II' of FIG. 6B.
Figure 8B:
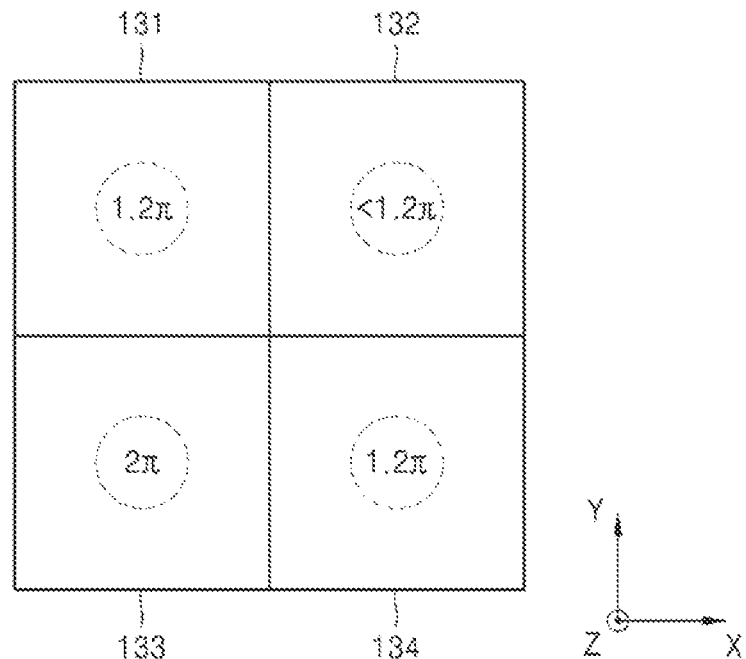
FIG. 8B shows a phase of red light passed through a color separating lens array at the centers of pixel-corresponding areas.
Figure 8C:
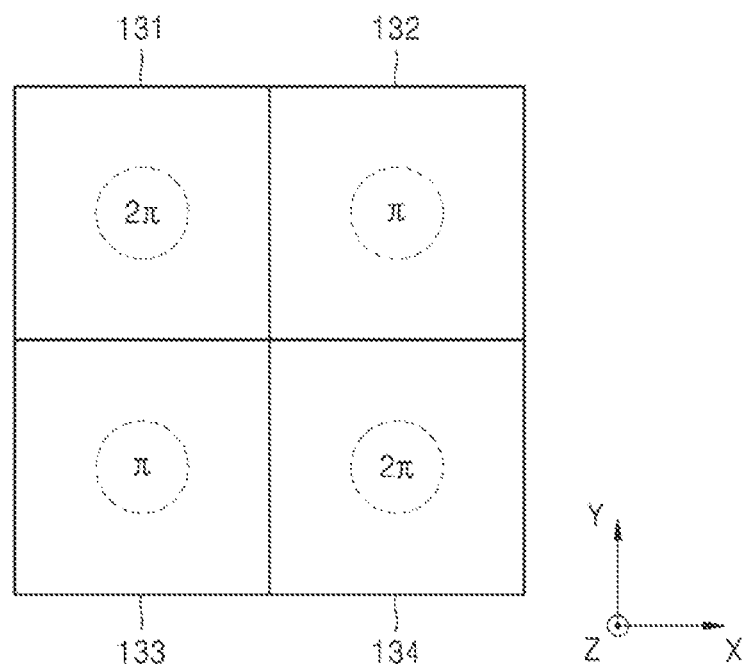
FIG. 8C shows a phase of green light passed through a color separating lens array at the centers of pixel-corresponding areas.

FIG. 8A shows phase profiles of red light and green light passed through the color separating lens array 130 along the line II-II' of FIG. 6B, FIG. 8B shows a phase of red light passed through the color separating lens array 130 at the centers of pixel-corresponding areas 131, 132, 133, and 134, and FIG. 8C shows a phase of green light passed through the color separating lens array 130 at the centers of the pixel-corresponding areas 131, 132, 133, and 134.

With reference to FIGS. 8A and 8B, the red light passed through the color separating lens array 130 may have a phase profile maximized at the center of the red pixel-corresponding area 133 and reducing in a direction proceeding away from the center of the red pixel-corresponding area 133. For example, at a position right after light has passed the color separating lens array 130, the phase of red light may be maximized at the center of the red pixel-corresponding area 133, and gradually reduce in the shape of concentric circle in a direction proceeding away from the center of the red pixel-corresponding area 133 to be minimized at the center of the first and second green pixel-corresponding areas 131 and 134 in the X direction and the Y direction, and at the center of the blue pixel-corresponding area 132 in a diagonal direction. When the phase of the red light at the center of the red pixel-corresponding area 133 is 2π, the phase at the center of the first and second green pixel-corresponding area 131 and 134 may be, for example, 1.1π to 1.5π, and the phase at the center of the blue pixel-corresponding area 132 may be a value smaller than the phase at the center of the first and second green pixel-corresponding areas 131 and 134, for example, 1.3π to 0.9π.

The phase profile PPB of the red light is different from the first phase profile PPG1 of the green light as described above, and the reason is that the color separating lens array 130 is designed to allow the focal distance of the red light by the color separating lens array 130 to be similar to the focal distance of the green light as described with reference to FIGS. 3A and 3B. When the thickness of the spacer layer 120 is determined based on the focal distance of the green light, by adjusting the focal distance of the red light to be similar to the focal distance of the green light, the red light and the green light may be concentrated at the same distance, and accordingly, the auto focusing function may be improved when the red pixel is an auto focusing pixel including two or more light sensing cells. The adjusted focal distance of the red light may be 90% to 110% or 95% to 105% of the focal distance of the green light.

With reference to FIGS. 8A and 8B, the green light passed through the color separating lens array 130 may have a phase profile maximized at the center of the second green pixel-corresponding area 134 and reducing in a direction proceeding away from the center of the second green pixel-corresponding area 134. When comparing the first phase profile PPG1 of the green light of FIG. 7A and the second phase profile PPG2 of the green light of FIG. 8A, the second phase profile PPG2 of the green light may be the first phase profile PPG1 of the green light moved parallel by a pixel pitch in the X direction and the Y direction. That is, while the first phase profile PPG1 of the green light may be maximized at the center of the first green pixel-corresponding area 131, the second phase profile PPG2 of the green light may be maximized at the center of the second green pixel-corresponding area 134, which is spaced apart from the center of the first green pixel-corresponding area 131 by one pixel pitch in the X direction and the Y direction. The phase profiles of FIGS. 8B and 8C showing the profiles at the center of the pixel-corresponding area 131, 132, 133, and 134 may be the same. To explain the phase profile of the green light based on the second green pixel-corresponding area 134 again, when the phase of light emitted from the center of the second green pixel-corresponding area 131 is 2π, light having a phase of 0.9π to 1.1π may be emitted from the center of the blue and red pixel-corresponding areas 132 and 133, light of a phase of 2π may be emitted from the center of the first green pixel-corresponding area 131, and light of a phase of 1.1π to 1.5π may be emitted from the cross point between the first green pixel-corresponding area 131 and the second green pixel-corresponding area 134.

When comparing the second phase profile PPG2 of the green light and the phase profile PPR of the red light, the phase difference between the phase of the green light traveled through the center of the second green pixel-corresponding area 134 and the phase of the green light passed traveled through the center of the red pixel-corresponding area 133 may be greater than the phase difference between the phase of the red light traveled through the center of the red pixel-corresponding area 133 and the phase of the red light passed traveled through the center of the second green pixel-corresponding area 134 by, for example, 0.1π to 0.5π.

For example, the second phase profile PPG2 of the green light by the color separating lens array 130 and the phase profile PPR of the red light may be different, and the phase reduction rate for the green light in the X direction may be greater than the phase reduction rate of the red light in the X direction.

Further, a phase difference between the green light traveled through the center of the second green pixel-corresponding area 134, and the green light traveled through the center of the red pixel-corresponding area 133 may be 110% to 150% of a phase difference between the red light traveled through the center of the red pixel-corresponding area 133, and the red light traveled through the center of the second green pixel-corresponding area 134.

Figure 8D:
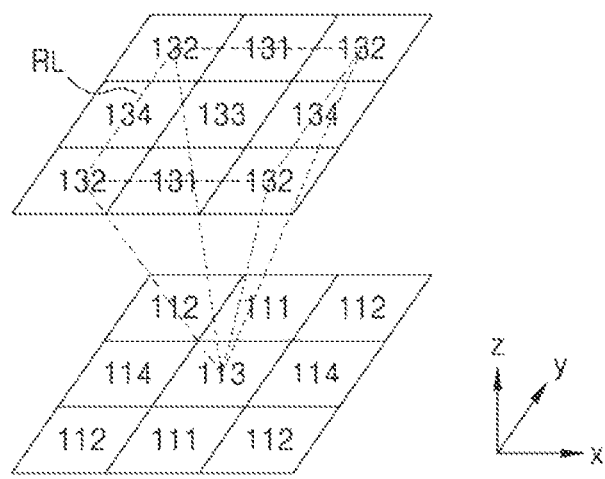
FIG. 8D illustrates an example of a proceeding direction of red light incident on a red light concentration area.
Figure 8E:
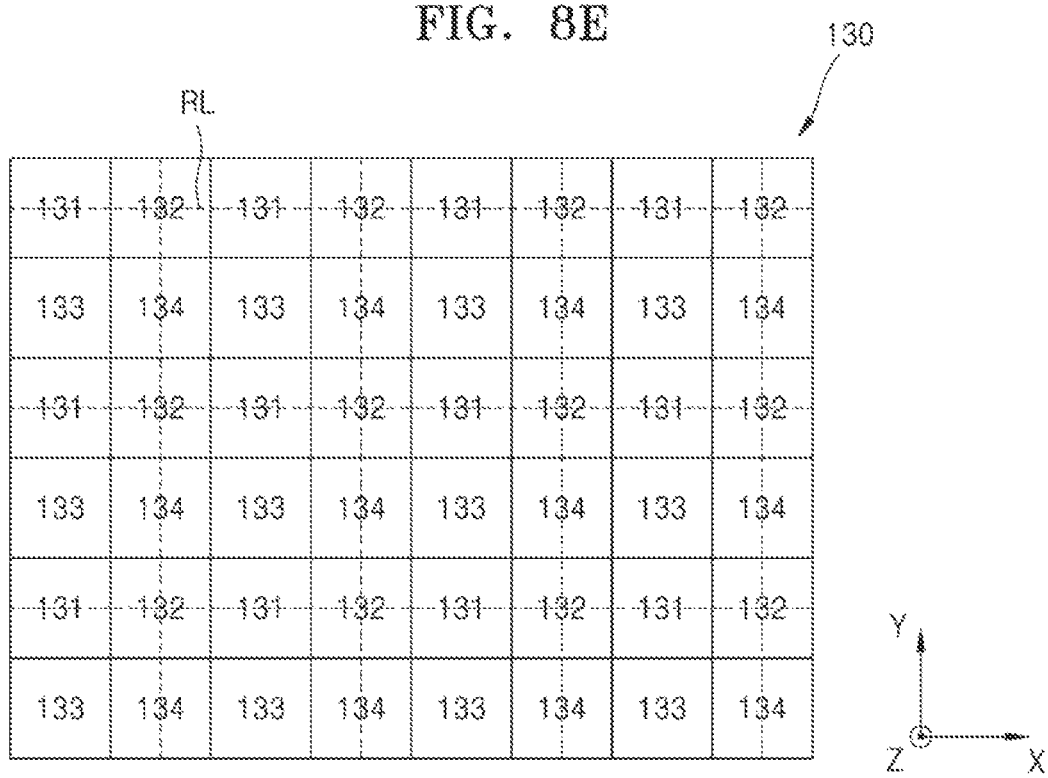
FIG. 8E is a diagram of an example of an array of a red light concentration area.

FIG. 8D illustrates an example of a proceeding direction of red light incident on a red light concentration area, and FIG. 8E is a diagram of an example of an array of a red light concentration area.

The red light may be concentrated to the red pixel 113 by the color separating lens array 130 as described in FIG. 8D, and red light from the pixel-corresponding areas 131, 132, 133, and 134 may be incident on the red pixel 113. That is, according to the phase profile of the red light described with reference to FIGS. 8A and 8B, the red light passed through the red light concentration area RL connecting the center of the four blue pixel-corresponding areas 133, which are adjacent to the red pixel-corresponding area 133 by engaging their vertexes, may be concentrated on the red pixel 113. Therefore, the color separating lens array 130 may operate as an array of a red light concentration area RL concentrating red light to the red pixel 113 as shown in FIG. 8E. The red light concentration area RL may be, for example, 1.5 to 4 times greater than the corresponding red pixel 113. Parts of the red light concentration area RL may overlap the first and second green light concentration areas GL1 and GL2 and the blue light concentration area BL.

Figure 8F:
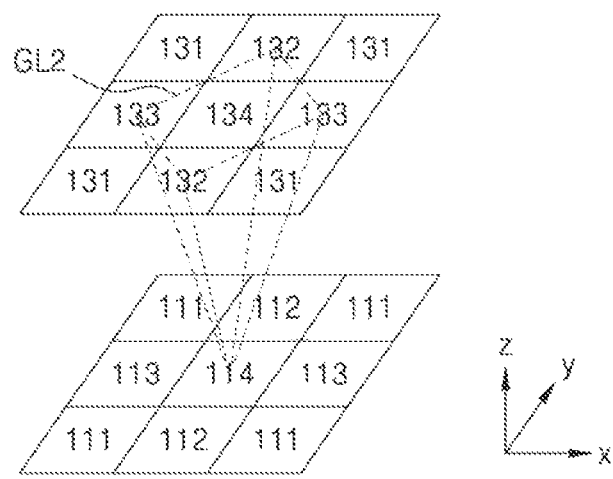
FIG. 8F illustrates an example of a proceeding direction of green light incident on a second green light concentration area.
Figure 8G:
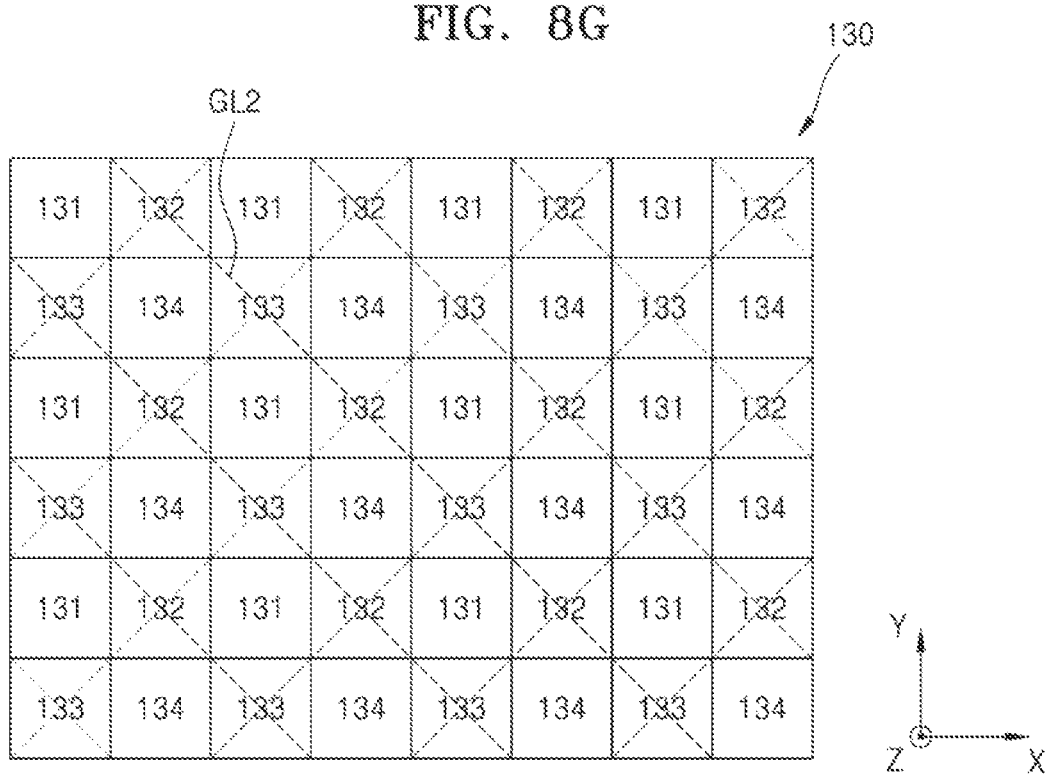
FIG. 8G is a diagram of an example of an array of a second green light concentration area.

FIG. 8F illustrates an example of a proceeding direction of green light incident on a second green light concentration area, and FIG. 8G is a diagram of an example of an array of a second green light concentration area.

With reference to FIG. 8F and FIG. 8G, the green light incident on the periphery of the second green pixel-corresponding area 134 may proceed in a similar way as the green light incident on the periphery of the first green pixel-corresponding area 131, and may be concentrated to the second green pixel 114 as illustrated in FIG. 8F. Therefore, the color separating lens array 130 may operate as an array of a second green light concentration area GL2 concentrating green light to the second green pixel 114 as shown in FIG. 8G. The second green light concentration area GL2 may be, for example, 1.2 to 2 times greater than the corresponding second green pixel 114.

When comparing the phase profile of the green light passed through the second green light concentration area GL2 and the phase profile of the red light passed through the red light concentration area RL, the phase difference between the green light traveled through the center of the second green light concentration area GL2 and the green light traveled through a position spaced apart from the center of the second green light concentration area GL2 by a pixel pitch of the sensor substrate, for example, the center of the red pixel-corresponding area 133 may be greater than the phase difference between the red light traveled through the center of the red light concentration area RL and the red light traveled through a position spaced apart from the center of the red light concentration area RL by a pixel pitch of the sensor substrate, for example, the center of the second green pixel-corresponding area 134. Similarly, the phase difference between the green light traveled through the center of the second green light concentration area GL2 and the green light traveled through a position spaced apart from the center of the second green light concentration area GL2 by ½ of a pixel pitch of the sensor substrate 110, for example, the center of the tangent line of the second green pixel-corresponding area 134 and the red pixel-corresponding area 133 may be greater than the phase difference between the red light traveled through the center of the red light concentration area RL and the red light traveled through a position spaced apart from the center of the red light concentration area RL by ½ of a pixel pitch of the sensor substrate 110, for example, the center of the tangent line of the second green pixel-corresponding area 134 and the red pixel-corresponding area 133.

Figure 9A:
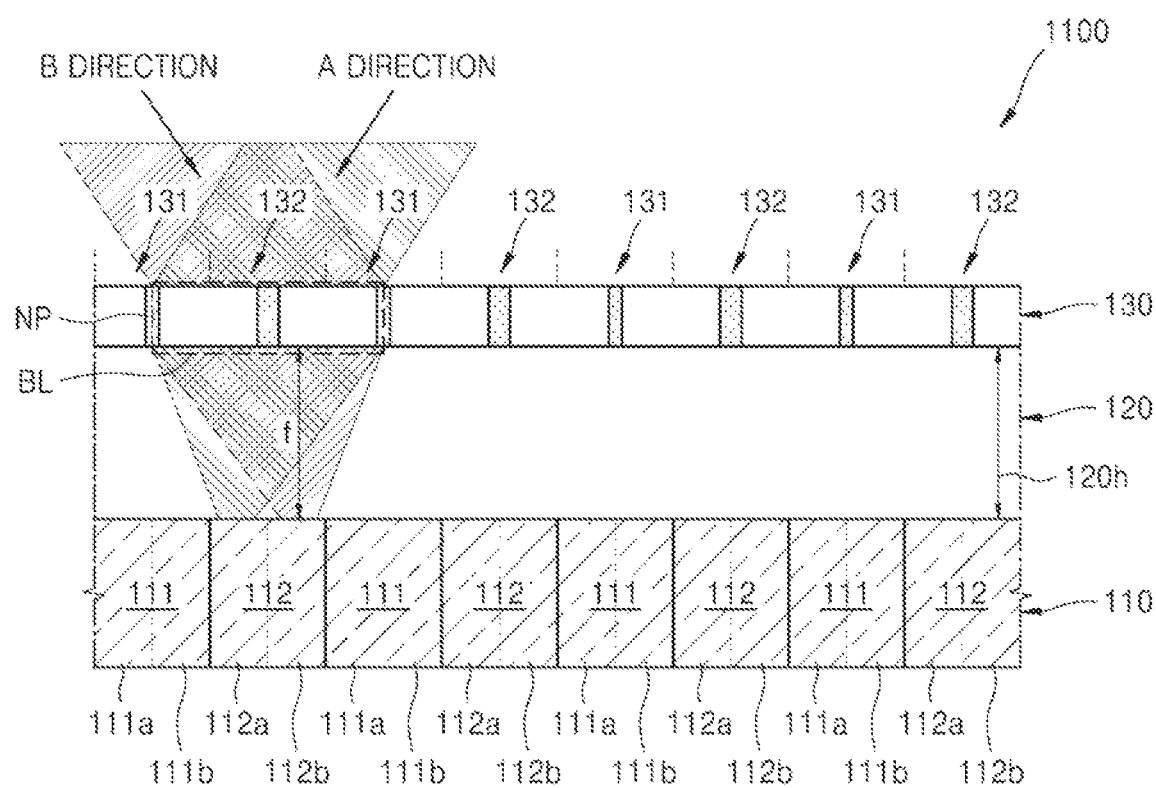
FIGS. 9A, 9B, and 9C are diagrams illustrating the relationship between a focal distance of a light concentration area and the auto focusing function.
Figure 9B:
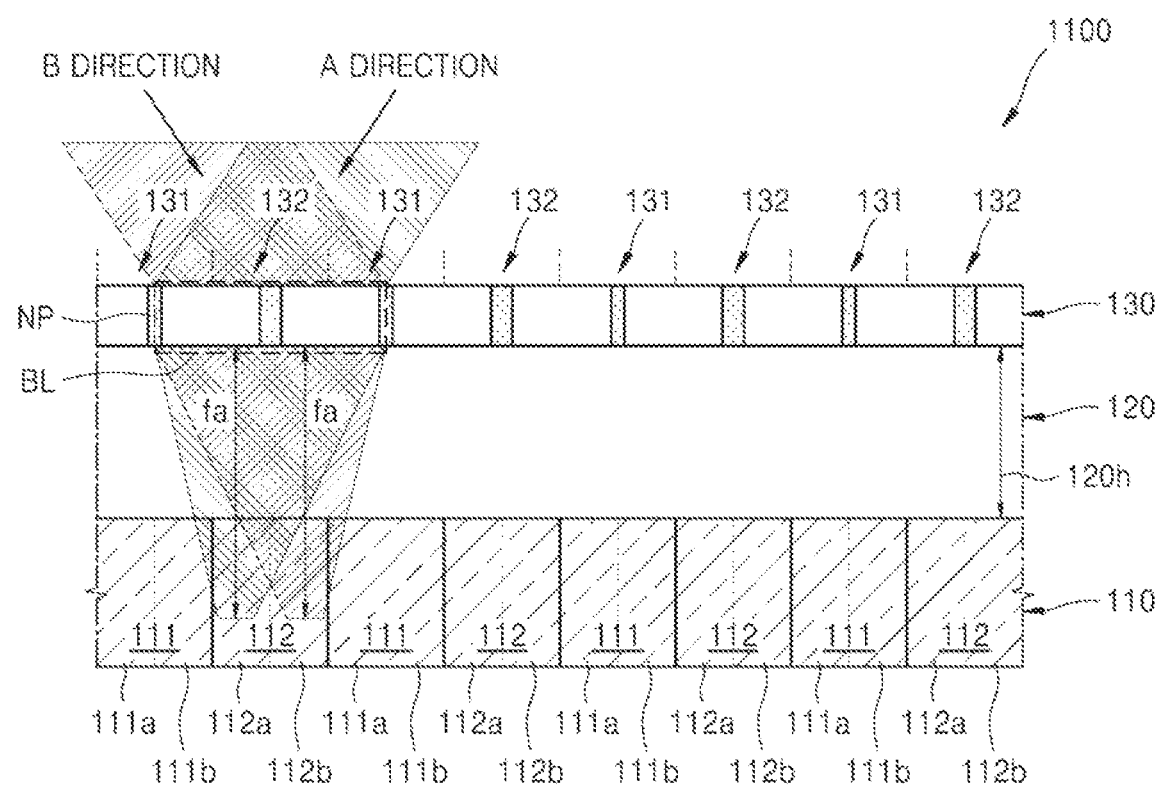
Figure 9C:
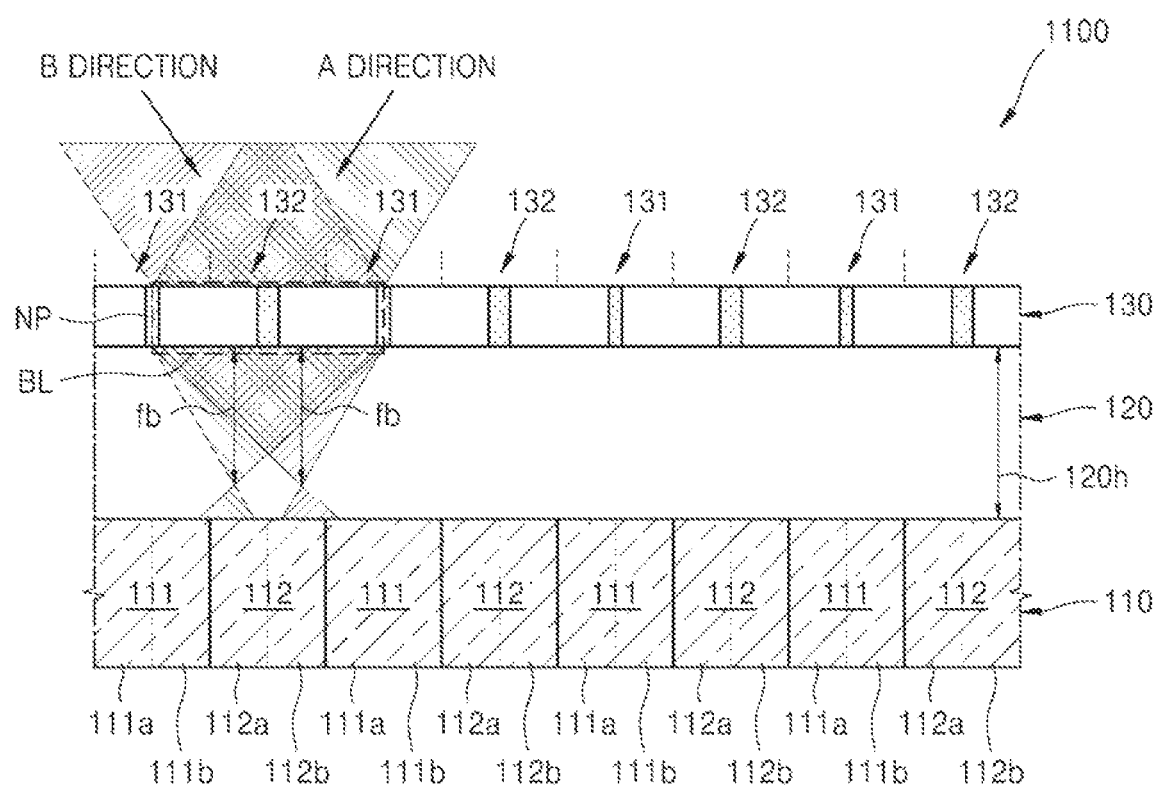

FIGS. 9A to 9C are diagrams for explaining the relationship between a focal distance of a light concentration area and the auto focusing function according to example embodiments.

As described briefly above, by using a pixel including two or more light sensing cells sharing a light concentration area, a signal necessary for focusing may be obtained. Specifically, information may be provided for the image sensor 1000 to focus by analyzing differences between signals sensed by light sensing cells arranged on one of two light sensing cells included in one pixel and sharing a concentration area, for example, first light sensing cells 111a, 112a, 113a, and 114a and signals sensed by light sensing cells arranged another one of two light sensing cells included in one pixel and sharing a concentration area, for example, second light sensing cells 111b, 112b, 113b, and 114b. At this time, the focal distance of the concentration areas GL1, GL2, BL, and RL may need to be similar to a distance between the color separating lens array 130 and the sensor substrate 110 so that signals sensed by the first light sensing cells 111a, 112a, 113a, 114a and signals sensed by the second light sensing cells 111b, 112b, 113b, and 114b can be clearly distinguished, which may lead to improved auto focusing function.

FIG. 9A illustrates an example in which the focal distance f of the blue light concentration area BL is identical to the thickness 120h of the spacer layer 120. With reference to FIG. 9A, light of 450 nm wavelength incident in the A direction toward the blue light concentration area BL may be incident on the first light sensing cell 112a of the second pixel 112, and light incident in the B direction may be incident on the second light sensing cell 112b. That is, the signal sensed by the first light sensing cell 112a of the second pixel 112 may represent an amount of light incident in the A direction, and the signal sensed by the second light sensing cell 112b of the second pixel 112 may represent an amount of light incident in the B direction. In this case, the difference between the signals sensed by the first and second light-sensing cells 112a and 112b may be clearly distinguished by the proceeding direction of the incident light.

FIG. 9B illustrates an example in which the focal distance f of the blue light concentration area BL is greater than the thickness 120h of the spacer layer 120. When the thickness 120h of the spacer layer 120 is determined based on the focal distance of the green light, and the phase profile of the blue light concentration area BL is designed to be identical to those of the green light concentration areas GL1 and GL2 as described with reference to FIGS. 3A and 3B, such phenomenon may occur because the focal distance of the green light is longer than the focal distance of the green light. With reference to FIG. 9B, light of 450 nm wavelength incident in the A direction toward the blue light concentration area BL may be incident not only on the first light sensing cell 112a of the second pixel 112 but also partially on the second light sensing cell 112b around the first light sensing cell 112a, and light incident in the B direction may be incident not only on the second light sensing cell 112b but also on the peripheral first light sensing cell 112a. As such, when the focal distance of the blue light concentration area BL is greater than the thickness of the spacer layer 120, the difference in the signals of each light sensing cell according to the direction of the incident light may become unclear, and the auto focusing function may be degraded.

FIG. 9C illustrates an example in which the focal distance fb of the blue light concentration area BL is shorter than the thickness 120h of the spacer layer 120. When the thickness 120h of the spacer layer 120 is determined based on the focal distance of the green light, and the phase profile of the red light concentration area RL is designed to be identical to those of the green light concentration areas GL1 and GL2 as described with reference to FIGS. 3A and 3B, such phenomenon may occur because the focal distance of the red light is shorter than the focal distance of the green light. With reference to FIG. 9C, light of 450 nm wavelength incident in the A direction toward the blue light concentration area BL may be incident not only on the first light sensing cell 112a of the second pixel 112 but also partially on the second light sensing cell 112b around the first light sensing cell 112a, and light incident in the B direction may be incident not only on the second light sensing cell 112b but also on the peripheral first light sensing cell 112a. As such, when the focal distance of the blue light concentration area BL is shorter as well as greater than the thickness of the spacer layer 120, the difference in the signals of each light sensing cell according to the direction of the incident light may become unclear, and the auto focusing function may be degraded. That is, the signals sensed by the first light sensing cells 111a, 112a, 113a, and 114a, and the signals sensed by the second light sensing cells 111b, 112b, 113b, and 114b may not be clearly distinguished.

As the image sensor 1000 including the pixel array 1100 described above hardly causes optical loss by a color filter, for example, an organic color filter, even though the size of pixels becomes smaller, sufficient light may be provided to the pixels. Accordingly, an ultra-high resolution and high-sensitivity micro-image sensor having billions of pixels may be produced. The image sensor 1000 having the above-described spectral filter may be employed in various high performance optical devices or high performance electronic devices. The electronic devices may include, for example, smart phones, mobile phones, cellular phones, personal digital assistants (PDAs), laptop computers, personal computers (PCs), various portable devices, home appliances, security cameras, medical cameras, automobiles, Internet of Things (IoT) devices, and other mobile or no-mobile computing devise, but the disclosure is not limited thereto.

The electronic devices may further include, in addition to the image sensor 1000, a processor for controlling an image sensor, for example, an application processor (AP), control a number of hardware or software constituent elements by driving operating systems or application programs through the processor, and perform various data processing and calculations. The processors may further include graphics processing units (GPUs) and/or image signal processors. When the processors include image signal processors, an image (or video) obtained through an image sensor may be stored and/or output using the processor.

Figure 10:
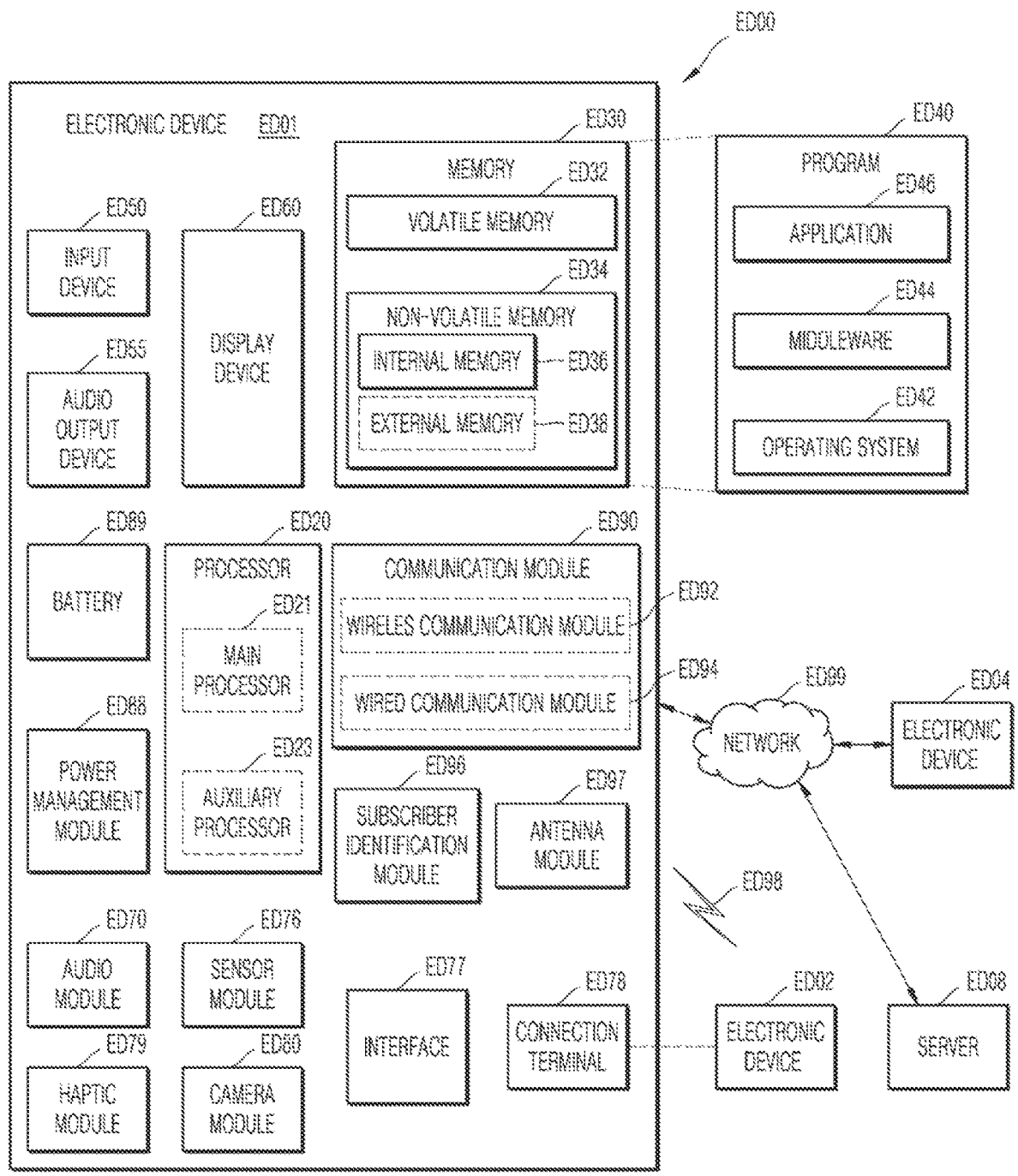
FIG. 10 is a block diagram of an electronic device including an image sensor according to example embodiments.

FIG. 10 is a schematic block diagram of an electronic device ED01 including the image sensor 1000, according to an embodiment. Referring to FIG. 10, in a network environment ED00, the electronic device ED01 may communicate with another electronic device ED02 through a first network ED98 (short-range wireless communication network, and the like), or communicate with another electronic device ED04 and/or a server ED08 through a second network ED99 (long-range wireless communication network, and the like). The electronic device ED01 may communicate with the electronic device ED04 through the server ED08. The electronic device ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (the display device ED60, and the like) of constituent elements may be omitted or other constituent elements may be added. Some of the constituent elements may be implemented by one integrated circuit. For example, the sensor module ED76 (a fingerprint sensor, an iris sensor, an illuminance sensor, and the like) may be implemented by being embedded in the display device ED60 (a display, and the like).

The processor ED20 may control one or a plurality of other constituent elements (hardware and software constituent elements, and the like) of the electronic device ED01 connected to the processor ED20 by executing software (a program ED40, and the like), and perform various data processing or calculations. As part of the data processing or calculations, the processor ED20 may load, in a volatile memory ED32, commands and/or data received from other constituent elements (the sensor module ED76, the communication module ED90, and the like), process the command and/or data stored in the volatile memory ED32, and store result data in a non-volatile memory ED34. The processor ED20 may include a main processor ED21 (a central processing unit, an application processor, and the like) and an auxiliary processor ED23 (a graphics processing unit, an image signal processor, a sensor hub processor, a communication processor, and the like) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some constituent elements (the display device ED60, the sensor module ED76, the communication module ED90, and the like) of the constituent elements of the electronic device ED01. The auxiliary processor ED23 (an image signal processor, a communication processor, and the like) may be implemented as a part of functionally related other constituent elements (the camera module ED80, the communication module ED90, and the like).

The memory ED30 may store various data needed by the constituent elements (the processor ED20, the sensor module ED76, and the like) of the electronic device ED01. The data may include, for example, software (the program ED40, and the like) and input data and/or output data about commands related thereto. The memory ED30 may include the volatile memory ED32 and/or the non-volatile memory ED34.

The program ED40 may be stored in the memory ED30 as software, and may include an operating system ED42, middleware ED44, and/or an application ED46.

The input device ED50 may receive commands and/or data to be used for constituent elements (the processor ED20, and the like) of the electronic device ED01, from the outside (a user, and the like) of the electronic device ED01. The input device ED50 may include a microphone, a mouse, a keyboard, and/or a digital pen (a stylus pen, and the like).

The audio output device ED55 may output an audio signal to the outside of the electronic device ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device ED60 may visually provide information to the outside of the electronic device ED01. The display device ED60 may include a display, a hologram device, or a projector, and a control circuit to control a corresponding device. The display device ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (the electronic device ED02, and the like) connected to the audio output device ED55 and/or the electronic device ED01 in a wired or wireless manner.

The sensor module ED76 may detect an operation state (power, temperature, and the like) of the electronic device ED01, or an external environment state (a user state, and the like), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface ED77 may support one or a plurality of specified protocols used for the electronic device ED01 to be connected to another electronic device (the electronic device ED02, and the like) in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (the electronic device ED02, and the like). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the image sensor 1000 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (the electronic device ED02, the electronic device ED04, the server ED08, and the like), and support a communication through an established communication channel. The communication module ED90 may be operated independent of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic device through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module ED92 may verify and authenticate the electronic device ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic device, and the like) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (an RFIC, and the like) than the antenna may be included as a part of the antenna module ED97.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 needs to perform a function or service, the electronic device ED01 may request one or a plurality of electronic devices to perform part of the whole of the function or service, instead of performing the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 11:
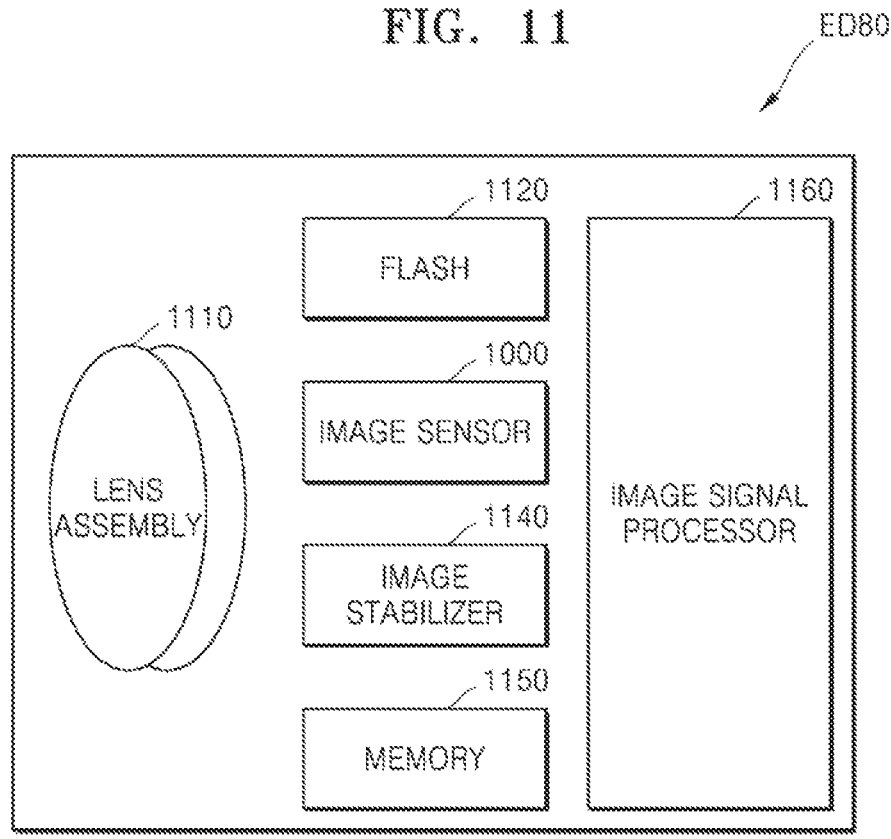
FIG. 11 is a block diagram of the camera module of FIG. 10.

FIG. 11 is a block diagram of the camera module ED80 of FIG. 10. Referring to FIG. 11, the camera module ED80 may include a lens assembly 1110, a flash 1120, the image sensor 1000 (the image sensor 1000 of FIG. 1, and the like), an image stabilizer 1140, a memory 1150 (a buffer memory, and the like), and/or an image signal processor 1160. The lens assembly 1110 may collect light emitted from a subject for image capturing. The camera module ED80 may include a plurality of lens assemblies 1110, and in this case, the camera module ED80 may include a dual camera, a 360 degrees camera, or a spherical camera. Some of the lens assemblies 1110 may have the same lens attributes (a viewing angle, a focal length, auto focus, F Number, optical zoom, and the like), or different lens attributes. The lens assembly 1110 may include a wide angle lens or a telescopic lens.

The flash 1120 may emit light used to reinforce light emitted or reflected from a subject. The flash 1120 may include one or a plurality of light-emitting diodes (a red-green-blue (RGB) LED, a white LED, an infrared LED, an ultraviolet LED, and the like), and/or a xenon lamp. The image sensor 1000 may include the image sensor of FIG. 1, and convert light emitted or reflected from the subject and transmitted through the lens assembly 1110 into electrical signals, thereby obtaining an image corresponding to the subject. The image sensor 1000 may include one or a plurality of sensors selected from image sensors having different attributes such as an RGB sensor, a black and white (BW) sensor, an IR sensor, or UV sensor. Each sensor included in the image sensor 1000 may be implemented by a charged coupled device (CCD) sensor and/or a complementary metal oxide semiconductor (CMOS) sensor.

The image stabilizer 1140 may move, in response to a movement of the camera module ED80 or an electronic device ED01 including the same, one or a plurality of lenses included in the lens assembly 1110 or the image sensor 1000 in a particular direction or may compensate a negative effect due to the movement by controlling (adjusting a read-out timing, and the like) the movement characteristics of the image sensor 1000. The image stabilizer 1140 may detect a movement of the camera module ED80 or the electronic device ED01 by using a gyro sensor or an acceleration sensor arranged inside or outside the camera module ED80. The image stabilizer 1140 may be implemented in an optical form.

The memory 1150 may store a part or entire data of an image obtained through the image sensor 1000 for a subsequent image processing operation. For example, when a plurality of images are obtained at high speed, only low resolution images are displayed while the obtained original data (Bayer-Patterned data, high resolution data, and the like) is stored in the memory 1150. Then, the memory 1150 may be used to transmit the original data of a selected (user selection, and the like) image to the image signal processor 1160. The memory 1150 may be incorporated into the memory ED30 of the electronic device ED01, or configured to be an independently operated separate memory.

The image signal processor 1160 may perform image processing on the image obtained through the image sensor 1000 or the image data stored in the memory 1150. The image processing may include depth map generation, three-dimensional modeling, panorama generation, feature point extraction, image synthesis, and/or image compensation (noise reduction, resolution adjustment, brightness adjustment, blurring, sharpening, softening, and the like). The image signal processor 1160 may perform control (exposure time control, or read-out timing control, and the like) on constituent elements (the image sensor 1000, and the like) included in the camera module ED80. The image processed by the image signal processor 1160 may be stored again in the memory 1150 for additional processing or provided to external constituent elements (the memory ED30, the display device ED60, the electronic device ED02, the electronic device ED04, the server ED08, and the like) of the camera module ED80. The image signal processor 1160 may be incorporated into the processor ED20, or configured to be a separate processor operated independently of the processor ED20. When the image signal processor 1160 is configured by a separate processor from the processor ED20, the image processed by the image signal processor 1160 may undergo additional image processing by the processor ED20 and then displayed through the display device ED60.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a read side camera.

Figure 12:
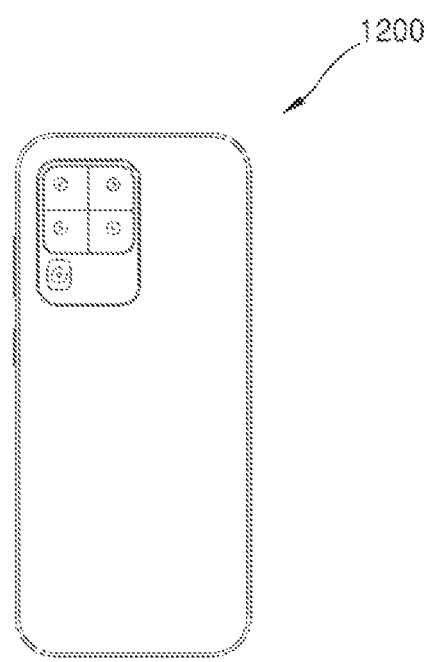
FIGS. 12, 13, 14, 15, 16, 17, 18, 19, 20, and 21 are diagrams of various examples of electronic devices employing image sensors according to example embodiments.
Figure 13:
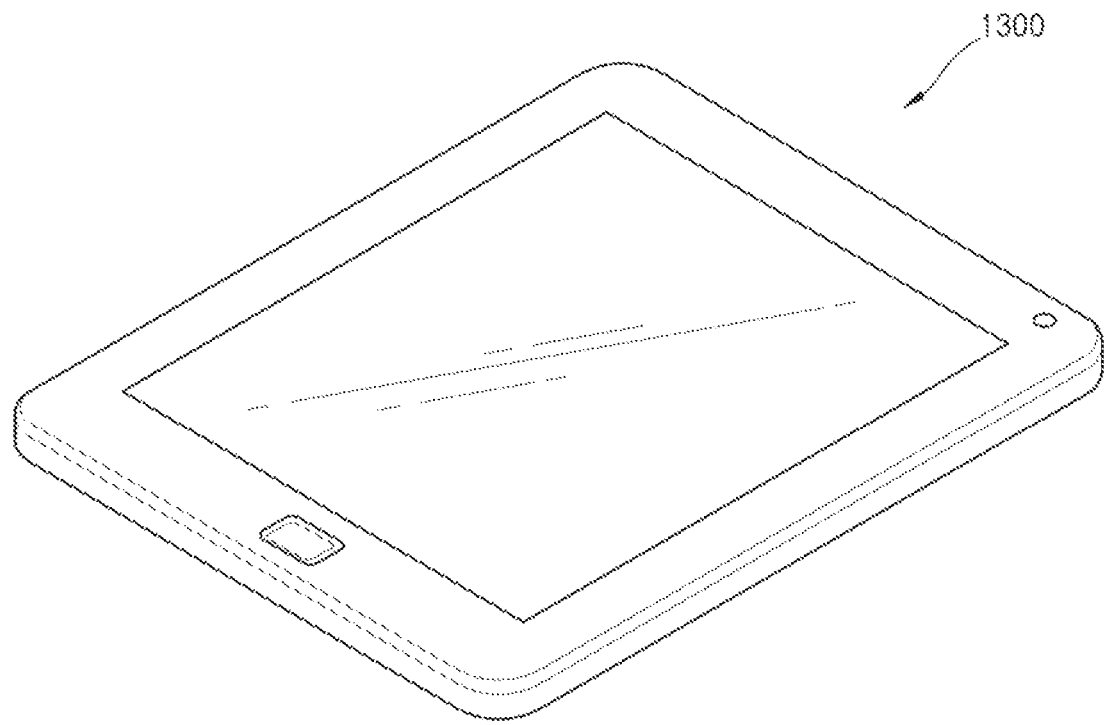
Figure 14:
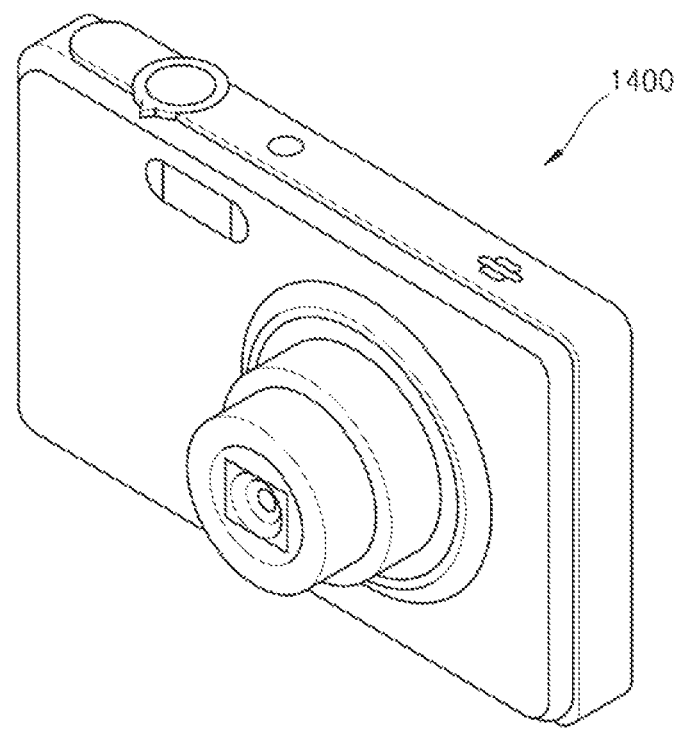
Figure 15:
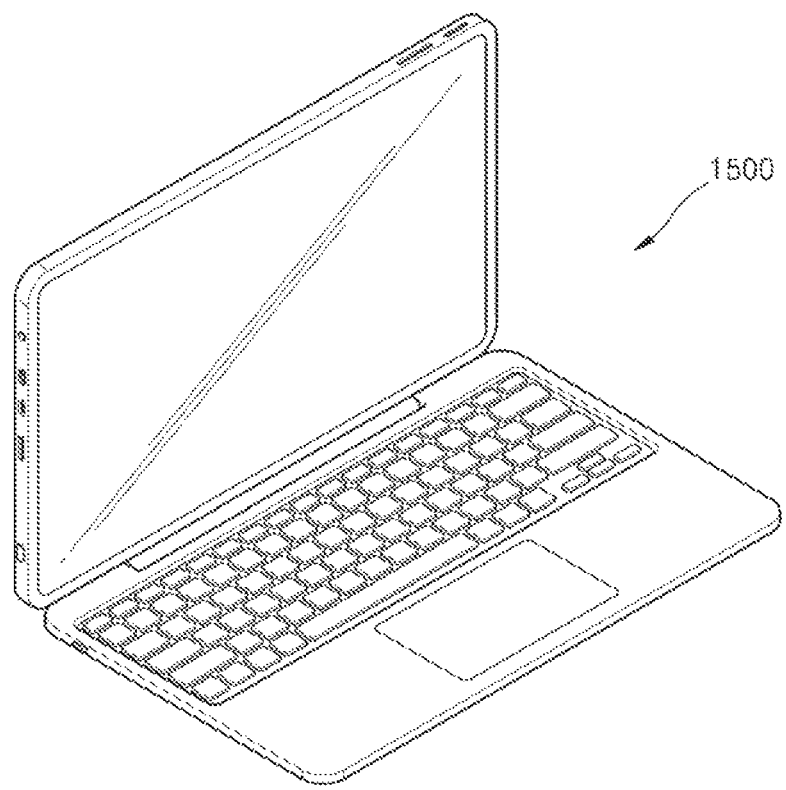
Figure 16:
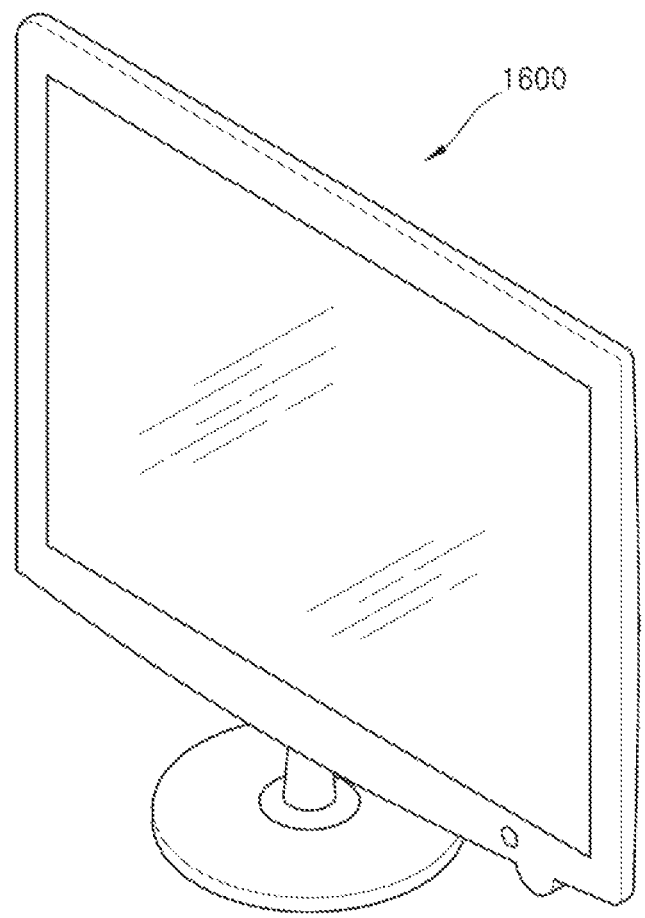

The image sensor 1000 according to example embodiments may be applied to a mobile phone or smartphone 1200 illustrated in FIG. 12, a tablet or smart tablet 1300 illustrated in FIG. 13, a digital camera or camcorder 1400 illustrated in FIG. 14, a notebook computer 1500 illustrated in FIG. 15, a television or smart television 1600 illustrated in FIG. 16, and the like. For example, the smartphone 1200 or the smart tablet 1300 may include a plurality of high resolution cameras, each having a high resolution image sensor mounted thereon. Depth information of subjects in an image may be extracted by using a high resolution cameras, out focusing of the image may be adjusted, or subjects in the image may be automatically identified.

Figure 17:
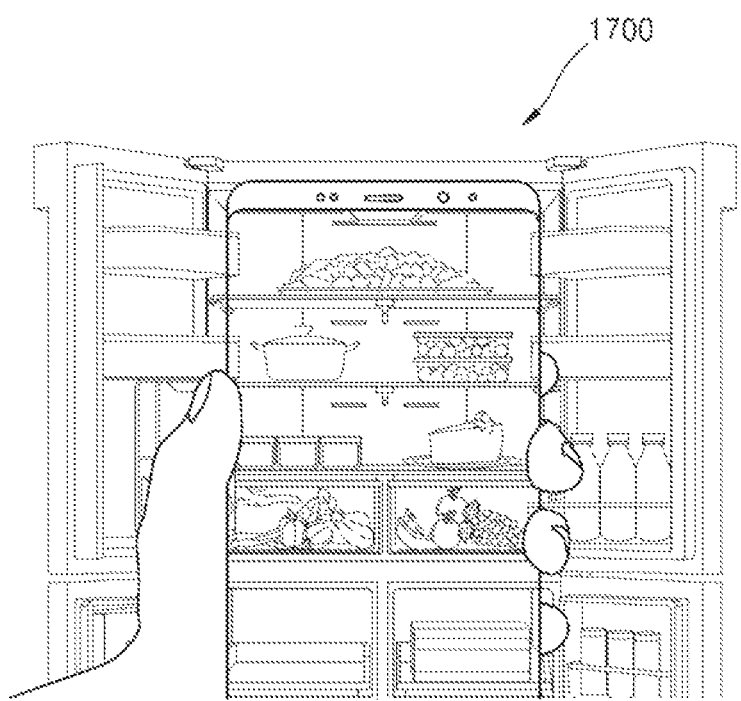
Figure 18:
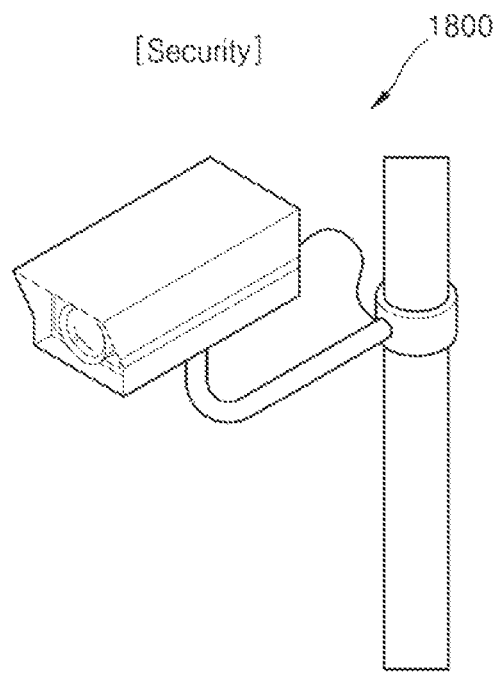
Figure 19:
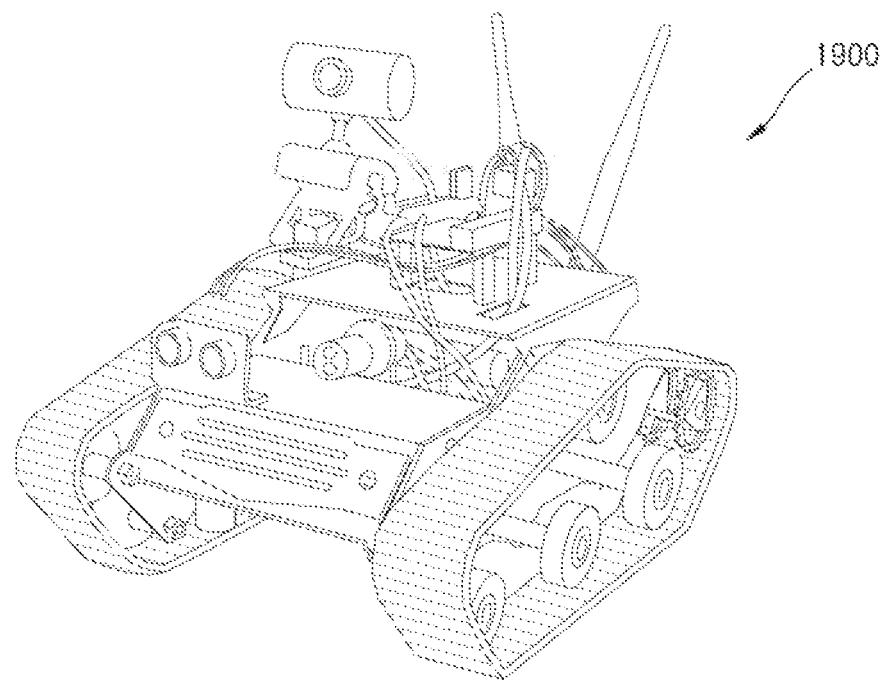
Figure 20:
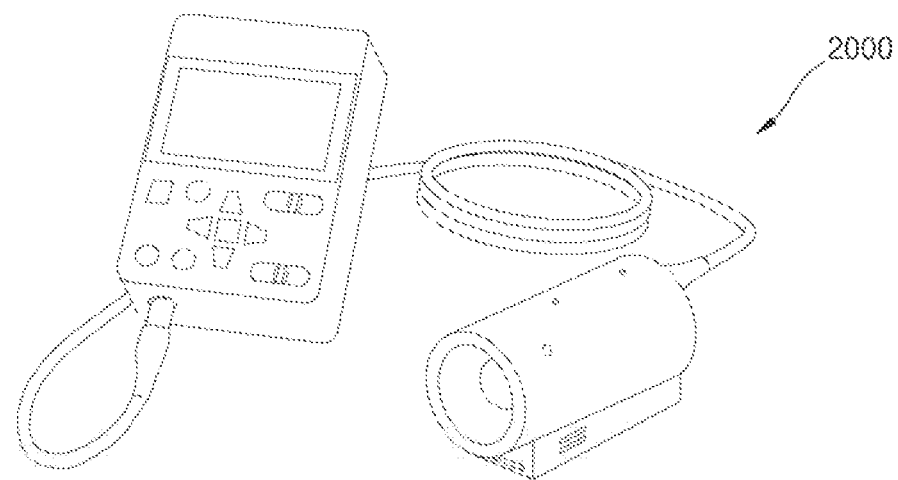

Furthermore, the image sensor 1000 may be applied to a smart refrigerator 1700 illustrated in FIG. 17, a security camera 1800 illustrated in FIG. 18, a robot 1900 illustrated in FIG. 19, a medical camera 2000 illustrated in FIG. 20, and the like. For example, the smart refrigerator 1700 may automatically recognize food in a refrigerator, by using an image sensor, and notify a user of the presence of a particular food, the type of food that is input or output, and the like, through a smartphone. The security camera 1800 may provide an ultrahigh resolution image and may recognize an object or a person in an image in a dark environment by using high sensitivity. The robot 1900 may be provided in a disaster or industrial site that is not directly accessible by people, and may provide a high resolution image. The medical camera 2000 may provide a high resolution image for diagnosis or surgery, and thus a field of vision may be dynamically adjusted.

Figure 21:
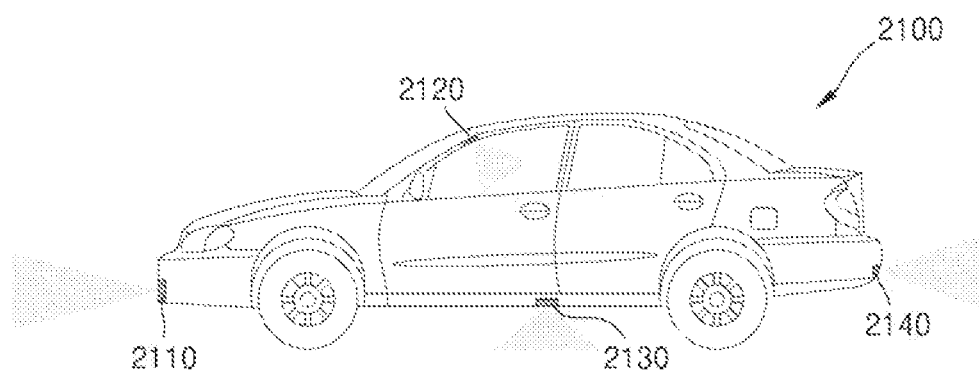

Furthermore, the image sensor 1000 may be applied to a vehicle 2100 as illustrated in FIG. 21. The vehicle 2100 may include a plurality of vehicle cameras 2110, 2120, 2130, and 2140 arranged at various positions. Each of the vehicle cameras 2110, 2120, 2130, and 2140 may include an image sensor according to an embodiment. The vehicle 2100 may provide a driver with various pieces of information about the inside or periphery of the vehicle 2100, by using the vehicle cameras 2110, 2120, 2130, and 2140, and thus an object or a person in an image may be automatically recognized and information needed for autonomous driving is provided.

Although an image sensor including the above-described color separating lens array and an electronic device including the image sensor is described with reference to example embodiments illustrated in the drawings, such example embodiments are provided merely as an example, and it will be understood that various modifications and equivalents may be made from the example embodiments by a person skilled in the art. Thus, the example embodiments should be considered in a descriptive sense and not for purposes of limitation. The scope of rights is defined not by the detailed description of example embodiments but by the appended claims, and all differences within the scope will be construed as being included in the scope of rights.

The color separating lens array may concentrate incident light by through separation based on a wavelength while not absorbing or blocking the incident light, which may leads to improved light utilization efficiency of the image sensor. Further, by adjusting a phase profile by a light concentration area included in the color separating lens array differently according to a wavelength, the auto focusing function may be improved.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
    a sensor substrate comprising a first pixel configured to sense light of a first wavelength, and a second pixel configured to sense light of a second wavelength; and
    a color separating lens array configured to concentrate, among incident light, the light of the first wavelength on the first pixel, and the light of the second wavelength on the second pixel,
    wherein the color separating lens array comprises:
        a first pixel-corresponding area corresponding to the first pixel; and
        a second pixel-corresponding area corresponding to the second pixel,
    wherein the first pixel corresponding area comprises a nanopost arranged to face the first pixel and the second pixel corresponding area comprises a nanopost arranged to face the second pixel such that a first phase difference between the light of the first wavelength that has traveled through a center of the first pixel-corresponding area and the light of the first wavelength that has traveled through a center of the second pixel-corresponding area is different than a second phase difference between the light of the second wavelength that has traveled through the center of the first pixel-corresponding area and the light of the second wavelength that has traveled through the center of the second pixel-corresponding area,
    wherein a size of the first-pixel corresponding area is equal to a size of the first pixel and a size of the second-pixel corresponding area is equal to a size of the second pixel, and
    wherein the first wavelength is longer than the second wavelength, and the first phase difference is smaller than the second phase difference.

2. The image sensor of claim 1, wherein the first pixel comprises at least two light sensing cells configured to sense the light of the first wavelength.

3. The image sensor of claim 2, wherein the second pixel comprises at least two light sensing cells configured to sense the light of the second wavelength.

4. The image sensor of claim 1, wherein the light of the first wavelength that has traveled through the center of the first pixel-corresponding area has a phase profile decreasing in a direction away from the center of the first pixel-corresponding area, and
    wherein the light of the second wavelength that has traveled through the center of the second pixel-corresponding area has a phase profile decreasing in a direction away from the center of the second pixel-corresponding area.

5. The image sensor of claim 4,
    wherein the first phase difference is 60% to 90% of the second phase difference.

6. The image sensor of claim 4,
    wherein the first phase difference is in range of $0.9\pi$ to $1.1\pi$, and
    wherein the second phase difference is in a range of $1.1\pi$ to $1.5\pi$.

7. An image sensor comprising:
    a sensor substrate comprising a first pixel configured to sense light of a first wavelength, and a second pixel configured to sense light of a second wavelength; and
    a color separating lens array comprising a first-wavelength light concentration area configured to concentrate, among incident light, the light of the first wavelength on the first pixel, and a second-wavelength light concentration area configured to concentrate, among incident light, the light of the second wavelength on the second pixel, wherein an area of the first-wavelength light concentration area is greater than an area of the first pixel, and an area of the second-wavelength light concentration area is greater than an area of the second pixel, wherein a second focal distance of the light of the second wavelength by the second-wavelength light concentration area is 90% to 100% of a first focal distance of the light of the first wavelength by the first-wavelength light concentration area, wherein the color separating lens array further comprises a first pixel-corresponding area corresponding to the first pixel and comprising a nanopost facing the first pixel and a second pixel-corresponding area corresponding to the second pixel and comprising a nanopost facing the second pixel, wherein a size of the first-pixel corresponding area is equal to a size of the first pixel and a size of the second-pixel corresponding area is equal to a size of the second pixel, wherein a first phase difference between the light of the first wavelength that has traveled through a center of the first pixel-corresponding area and the light of the first wavelength that has traveled through a center of the second pixel-corresponding area is different than a second phase difference between the light of the second wavelength that has traveled through the center of the first pixel-corresponding area and the light of the second wavelength that has traveled through the center of the second pixel-corresponding area, and wherein the first wavelength is shorter than the second wavelength, and the first phase difference is greater than the second phase difference.

8. The image sensor of claim 7, wherein the first pixel comprises at least two light sensing cells configured to sense the light of the first wavelength.

9. The image sensor of claim 8, wherein the second pixel comprises at least two light sensing cells configured to sense the light of the second wavelength.

10. The image sensor of claim 7, wherein the light of the first wavelength that has traveled through a center of the first-wavelength light concentration area has a phase delay profile decreasing in a direction away from the center of the first-wavelength light concentration area, and wherein the light of the second wavelength that has traveled through a center of the second-wavelength light concentration area has a phase delay profile decreasing in a direction away from the center of the second-wavelength light concentration area.

11. The image sensor of claim 10, wherein the first-wavelength light concentration area and the second-wavelength light concentration area partially overlap.

12. The image sensor of claim 11, wherein the second focal distance is the same as the first focal distance.

13. An image sensor comprising:
a sensor substrate comprising a first pixel configured to sense light of a first wavelength, and a second pixel configured to sense light of a second wavelength; and
a color separating lens array comprising a first-wavelength light concentration area configured to concentrate, among incident light, the light of the first wavelength on the first pixel, and a second-wavelength light concentration area configured to concentrate, among incident light, the light of the second wavelength on the second pixel, wherein an area of the first-wavelength light concentration area is greater than an area of the first pixel, and an area of the second-wavelength light concentration area is greater than an area of the second pixel, wherein the light of the first wavelength that has traveled through a center of the first-wavelength light concentration area has a phase profile maximized at the center of the first-wavelength light concentration area and decreasing in a direction away from the center of the first-wavelength light concentration area, wherein the light of the second wavelength that has traveled through a center of the second-wavelength light concentration area has a phase profile maximized at the center of the second-wavelength light concentration area and decreasing in a direction away from the center of the second-wavelength light concentration area, wherein a phase reduction rate of light of the first wavelength is different than a phase reduction rate of light of the second wavelength, and wherein the first wavelength is longer than the second wavelength, and the phase reduction rate of light of the first wavelength is smaller than the phase reduction rate of light of the second wavelength.

14. The image sensor of claim 13, wherein the first pixel comprises at least two light sensing cells configured to sense the light of the first wavelength.

15. The image sensor of claim 14, wherein the second pixel comprises at least two light sensing cells configured to sense the light of the second wavelength.

16. The image sensor of claim 13, wherein the first-wavelength light concentration area and the second-wavelength concentration area partially overlap.

17. An image sensor comprising:
a sensor substrate comprising a first pixel configured to sense light of a first wavelength, and a second pixel configured to sense light of a second wavelength; and
a color separating lens array comprising a first-wavelength light concentration area configured to concentrate, among incident light, the light of the first wavelength on the first pixel, and a second-wavelength light concentration area configured to concentrate, among incident light, the light of the second wavelength on the second pixel, wherein a first phase difference between the light of the first wavelength that has traveled through a center of the first-wavelength light concentration area and the light of the first wavelength that has traveled through a position spaced apart from the center of the first-wavelength light concentration area by ½ of a pixel pitch of the sensor substrate is different than a second phase difference between the light of the second wavelength that has traveled through a center of the second-wavelength light concentration area and the light of the second wavelength that has traveled through a position spaced apart from the center of the second-wavelength light concentration area by ½ of the pixel pitch of the sensor substrate, and wherein the first wavelength is longer than the second wavelength, and the first phase difference is smaller than the second phase difference.

18. The image sensor of claim 17, wherein the first pixel comprises at least two light sensing cells configured to sense the light of the first wavelength.

19. The image sensor of claim 18, wherein the second pixel comprises at least two light sensing cells configured to sense the light of the second wavelength.

20. The image sensor of claim 17, wherein an area of the first-wavelength light concentration area is greater than an area of the first pixel, and an area of the second-wavelength light concentration area is greater than an area of the second pixel.

21. An electronic device comprising:
an image sensor configured to convert an optical image into an electrical signal; and
a processor configured to control operations of the image sensor, and store and output a signal generated by the image sensor,
wherein the image sensor comprises:
a sensor substrate comprising a first pixel configured to sense light of a first wavelength, and a second pixel configured to sense light of a second wavelength; and
a color separating lens array comprising a first-wavelength light concentration area configured to concentrate, among incident light, the light of the first wavelength on the first pixel, and a second-wavelength light concentration area configured to concentrate, among incident light, the light of the second wavelength on the second pixel,
wherein an area of the first-wavelength light concentration area is greater than an area of the first pixel, and an area of the second-wavelength light concentration area is greater than an area of the second pixel, and
wherein a second focal distance of the light of the second wavelength by the second-wavelength light concentration area is 90% to 100% of a first focal distance of the light of the first wavelength by the first-wavelength light concentration area,
wherein the color separating lens array further comprises a first pixel-corresponding area corresponding to the first pixel and comprising a nanopost facing the first pixel and a second pixel-corresponding area corresponding to the second pixel and comprising a nanopost facing the second pixel,
wherein a size of the first-pixel corresponding area is equal to a size of the first pixel and a size of the second-pixel corresponding area is equal to a size of the second pixel,
wherein a first phase difference between the light of the first wavelength that has traveled through a center of the first pixel-corresponding area and the light of the first wavelength that has traveled through a center of the second pixel-corresponding area is different than a second phase difference between the light of the second wavelength that has traveled through the center of the first pixel-corresponding area and the light of the second wavelength that has traveled through the center of the second pixel-corresponding area, and
wherein the first wavelength is longer than the second wavelength, and the first phase difference is smaller than the second phase difference.

22. The electronic device of claim 21, wherein the first pixel comprises at least two light sensing cells configured to sense the light of the first wavelength.

23. The electronic device of claim 22, wherein the second pixel comprises at least two light sensing cells configured to sense light of the second wavelength.

24. The electronic device of claim 21, wherein the light of the first wavelength that has traveled through the center of the first-wavelength light concentration area has a phase delay profile decreasing in a direction away from a center of the first-wavelength light concentration area, and
wherein the light of the second wavelength that has traveled through a center of the second-wavelength light concentration area has a phase delay profile decreasing in a direction away from the center of the second-wavelength light concentration area.

25. The electronic device of claim 24, wherein the first-wavelength light concentration area and the second-wavelength light concentration area partially overlap.

26. The electronic device of claim 25, wherein the second focal distance is identical to the first focal distance.

* * * * *